United States Patent
Yoo et al.

(10) Patent No.: US 12,105,920 B2
(45) Date of Patent: Oct. 1, 2024

(54) DISPLAY DEVICE AND TOUCH INPUT SYSTEM INCLUDING THE SAME

(71) Applicant: Samsung Display Co., Ltd., Yongin-Si (KR)

(72) Inventors: Gi Na Yoo, Cheonan-si (KR); Ju Yeon Kim, Asan-si (KR); Won Sang Park, Yongin-si (KR); Chang Woo Shim, Cheonan-si (KR); Seong Jun Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 4 days.

(21) Appl. No.: 17/884,877

(22) Filed: Aug. 10, 2022

(65) Prior Publication Data

US 2023/0214072 A1     Jul. 6, 2023

(30) Foreign Application Priority Data

Jan. 5, 2022   (KR) .................. 10-2022-0001348

(51) Int. Cl.
*G06F 3/044*     (2006.01)
*G06F 3/041*     (2006.01)
(Continued)

(52) U.S. Cl.
CPC .......... *G06F 3/0446* (2019.05); *G06F 3/0412* (2013.01); *G06F 3/0441* (2019.05);
(Continued)

(58) Field of Classification Search
CPC .. G06F 3/03545; G06F 3/0412; G06F 3/0446; G06F 3/0443; G06F 2203/04103;
(Continued)

(56) References Cited

U.S. PATENT DOCUMENTS 9,170,449 B2 * 10/2015 Baek .................. G06F 3/0317
9,495,041 B2 * 11/2016 Baek .................. G06F 3/0317
(Continued)

FOREIGN PATENT DOCUMENTS

CN          108874220    * 11/2018  ............ G06F 3/041
CN          108874220 A    11/2018
(Continued)

OTHER PUBLICATIONS

European Search Report corresponding to European Patent Application No. 22211955.4 dated May 30, 2023, 9 pages.

*Primary Examiner* — Olga V Merkoulova

(74) *Attorney, Agent, or Firm* — Innovation Counsel LLP

(57) ABSTRACT

The present disclosure relates to a display device capable of performing a touch input by a touch input device, and a touch input system including the same. According to an embodiment of the disclosure, a display device comprising a display unit comprising a plurality of emission areas, a plurality of touch electrodes disposed between the plurality of emission areas to sense a touch, a plurality of code patterns formed by covering a part of a front surface of at least one of the plurality of touch electrodes with a predetermined code shape, and a plurality of light-blocking patterns formed on at least one of the plurality of touch electrodes on which the plurality of code patterns is not formed, to block light, wherein the plurality of light-blocking patterns is formed by covering at least one of a front surface and side surfaces of the at least one touch electrode with a predetermined pattern shape.

20 Claims, 21 Drawing Sheets

(51) Int. Cl.
 *H10K 50/86* (2023.01)
 *H10K 59/40* (2023.01)
 *H10K 59/88* (2023.01)
(52) U.S. Cl.
 CPC ......... *G06F 3/0442* (2019.05); *H10K 50/865* (2023.02); *H10K 59/40* (2023.02); *H10K 59/88* (2023.02); *G06F 2203/04112* (2013.01)
(58) Field of Classification Search
 CPC ........... G06F 2203/04112; G06F 3/044; H10K 59/40; H01L 33/58
 See application file for complete search history.

(56) References Cited

U.S. PATENT DOCUMENTS

| | | | |
|---|---|---|---|
| 10,620,754 B2 | 4/2020 | Weaver et al. | |
| 11,462,718 B2* | 10/2022 | Choi | H10K 59/40 |
| 11,586,064 B2* | 2/2023 | Hyun | H10K 59/32 |
| 11,797,135 B2* | 10/2023 | Jeong | G06F 3/0446 |
| 2012/0249490 A1* | 10/2012 | Lee | G06F 3/042 |
| | | | 345/179 |
| 2014/0211103 A1* | 7/2014 | Baek | G02F 1/133753 |
| | | | 349/110 |
| 2016/0054857 A1* | 2/2016 | Baek | G02F 1/133512 |
| | | | 349/110 |
| 2017/0364175 A1* | 12/2017 | Park | G06F 3/0412 |
| 2017/0364194 A1* | 12/2017 | Jang | H10K 59/40 |
| 2018/0004027 A1* | 1/2018 | Lin | G02F 1/133516 |
| 2018/0307075 A1* | 10/2018 | Jeong | G02F 1/13338 |
| 2019/0051711 A1* | 2/2019 | Lee | G09G 3/3208 |
| 2019/0115411 A1* | 4/2019 | Park | G06F 3/0412 |
| 2019/0341428 A1 | 11/2019 | Lee et al. | |
| 2020/0004381 A1* | 1/2020 | Han | H10K 59/40 |
| 2020/0295310 A1* | 9/2020 | Moon | H10K 50/865 |
| 2021/0320163 A1* | 10/2021 | Bang | H10K 59/131 |
| 2022/0077431 A1* | 3/2022 | Lee | H10K 59/122 |
| 2022/0229514 A1* | 7/2022 | Park | H10K 59/40 |
| 2023/0015262 A1* | 1/2023 | Shim | G06F 3/0317 |
| 2023/0023671 A1 | 1/2023 | Shim et al. | |

FOREIGN PATENT DOCUMENTS

| | | |
|---|---|---|
| EP | 4124936 A1 | 2/2023 |
| JP | 2014-048728 A | 3/2014 |
| KR | 2012-0110817 A | 10/2012 |
| KR | 10-1373203 B1 | 3/2014 |
| KR | 2019-0016635 A | 2/2019 |
| KR | 10-2023-0016737 A | 2/2023 |

* cited by examiner

DPd: DP3

DPd: DP1, DP2, DP3

DISPLAY DEVICE AND TOUCH INPUT SYSTEM INCLUDING THE SAME

This application claims priority from Korean Patent Application No. 10-2022-0001348 filed on Jan. 5, 2022 in the Korean Intellectual Property Office, and all the benefits accruing therefrom under 35 U.S.C. 119, the contents of which in its entirety are herein incorporated by reference.

BACKGROUND

1. Field of the Disclosure

The present disclosure relates to a display device and a touch input system including the same.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions. Display devices may be flat panel display devices such as a liquid-crystal display device, a field emission display device, and an organic light-emitting display device. Among such flat panel display devices, a light-emitting display device includes a light-emitting element that can emit light on its own, so that each of the pixels of the display panel can emit light by themselves. Accordingly, a light-emitting display device can display images without a backlight unit that supplies light to the display panel.

Recently, a display device supports a touch input using a part of a user's body (e.g., a finger) and a touch input using an electronic pen. By sensing a touch input with an electronic pen, the display device can sense the touch input more precisely than a display device using only a touch input by a part of the user's body.

SUMMARY

Aspects of the present disclosure provide a display device capable of performing a touch input by a touch input device using code patterns of a display panel, and a touch input system including the same.

Aspects of the present disclosure also provide a display device capable of improving the recognition rate of code patterns by reducing the light reflectance of the display panel, and a touch input system including the same.

It should be noted that aspects of the present disclosure are not limited to the above-mentioned aspects and other aspects of the present disclosure will be apparent to those skilled in the art from the following descriptions.

According to an embodiment of the disclosure, a display device comprising a display unit comprising a plurality of emission areas, a plurality of touch electrodes disposed between the plurality of emission areas to sense a touch, a plurality of code patterns formed by covering a part of a front surface of at least one of the plurality of touch electrodes with a predetermined code shape, and a plurality of light-blocking patterns formed on at least one of the plurality of touch electrodes on which the plurality of code patterns is not formed, to block light, wherein the plurality of light-blocking patterns is formed by covering at least one of a front surface and side surfaces of the at least one touch electrode with a predetermined pattern shape.

In an embodiment, a shape of the plurality of code patterns when viewed from top is one of a closed loop shape of at least one of a rectangle, a square, a circle and a diamond; an open loop shape partially surrounding at least one of the plurality of emission areas; and a straight line shape having a predetermined length.

In an embodiment, the plurality of code patterns and the plurality of light-blocking patterns comprise an inorganic or organic black pigment absorbing infrared or ultraviolet light, and are formed by patterning to cover a part of at least one of a front surface and a side surface of at least one touch electrode among the plurality of touch electrodes such that they do not overlap each other.

In an embodiment, the plurality of touch electrodes comprises a plurality of driving electrodes, a plurality of sensing electrodes and a plurality of dummy electrodes, and wherein the plurality of driving electrodes, the plurality of sensing electrodes and the plurality of dummy electrodes are formed in a mesh structure surrounding between and around the emission areas.

In an embodiment, the plurality of light-blocking patterns is formed and arranged in at least one of: a straight line shape of a predetermined length, an open-loop shape bent to surround only a part of at least one of the plurality of emission areas, and a mesh shape surrounding each of the emission areas.

In an embodiment, the plurality of light-blocking patterns comprises first dummy patterns in a straight line shape that have a length of the straight line extended in a first diagonal direction according to a shape of the plurality of touch electrodes, and are arranged in parallel in a second diagonal direction perpendicular to the first diagonal direction.

In an embodiment, the first dummy patterns are disposed in the second diagonal direction of at least one of first to fourth emission areas of each pixel group, and are formed in the straight line shape so that the length of the straight line is extended in the first diagonal direction.

In an embodiment, the plurality of light-blocking patterns comprises second dummy patterns in a straight line shape that have a length of the straight line extended in a second diagonal direction according to a shape of the plurality of touch electrodes, and are arranged in parallel in a first diagonal direction perpendicular to the second diagonal direction.

In an embodiment, the second dummy patterns are disposed in the first diagonal direction of at least one of first to fourth emission areas of each pixel group, and are formed in the straight line shape so that the length of the straight line is extended in the second diagonal direction.

In an embodiment, the plurality of light-blocking patterns comprises third dummy patterns that surround some of the plurality of emission areas and have an overall shape formed in a mesh structure when viewed from top.

In an embodiment, the plurality of light-blocking patterns comprises first dummy patterns in a straight line shape that have a length of the straight line extended in a first diagonal direction according to a shape of the plurality of touch electrodes, and are arranged in parallel in a second diagonal direction perpendicular to the first diagonal direction; and second dummy patterns in a straight line shape that have a length of the straight line extended in the second diagonal direction according to the shape of the plurality of touch electrodes, and are arranged in parallel in the first diagonal direction perpendicular to the second diagonal direction.

In an embodiment, the length of the straight line of each of the first and second dummy patterns is larger than or smaller than an overall width and length of one of the plurality of code patterns.

In an embodiment, the plurality of light-blocking patterns further comprises third dummy patterns that surround some of the plurality of emission areas and have an overall shape formed in a mesh structure when viewed from top.

In an embodiment, the size and overall shape of each of the third dummy patterns when viewed from the top is different from those of an adjacent third dummy pattern.

In an embodiment, the first to third dummy patterns of difference shapes are arranged one after another repeatedly in the x-direction that is a horizontal direction, while the dummy patterns of a same shape are arranged in the y-direction that is a vertical direction when viewed from the top.

In an embodiment, the plurality of light-blocking patterns comprises fourth dummy patterns formed in a shape surrounding in a x-direction that is a horizontal direction or in a y-direction that is a vertical direction of at least one of first to fourth emission areas forming a pixel group.

In an embodiment, the plurality of light-blocking dummy patterns comprises fifth dummy patterns that are disposed in a first diagonal direction of at least two of first to fourth emission areas of a pixel group, and are formed so that a length of a straight line is extended in a second diagonal direction perpendicular to the first diagonal direction.

In an embodiment, the plurality of light-blocking dummy patterns comprises fifth dummy patterns that are disposed in a x-axis direction that is a horizontal direction of at least two of first to fourth emission areas of a pixel group, and are formed so that a length of a straight line is extended in a y-axis direction perpendicular to the x-axis direction.

According to an embodiment of the disclosure, a touch input system comprising a display device configured to display images, and a touch input device configured to input a touch to the display device, wherein the display device comprises a display unit comprising a plurality of emission areas, a plurality of touch electrodes disposed between the plurality of emission areas to sense a touch, a plurality of code patterns formed by covering a part of a front surface of at least one of the plurality of touch electrodes with a predetermined code shape, and a plurality of light-blocking patterns formed on at least one of the plurality of touch electrodes on which the plurality of code patterns is not formed, to block light, wherein the plurality of light-blocking patterns is formed by covering at least one of a front surface and side surfaces of the at least one touch electrode with a predetermined pattern shape.

In an embodiment, the touch input device comprises a code detector that detects the plurality of code patterns, a code processor that receives shape data for the plurality of code patterns, extracts a data code corresponding to the shape of the plurality of code patterns, and generates coordinate data corresponding to the data code, and a communications module that transmits the coordinate data to the display device.

According to embodiments of the present disclosure, a touch coordinate data of a touch input device on a display device in a touch input system can be generated and a touch input by the touch input device can be made without complicated calculation or correction by way of using code patterns of a display panel. In particular, touch input features can be performed based on accurate input coordinates, the cost can be saved, the power consumption can be reduced, and the driving process can become simpler.

In addition, according to embodiments of the present disclosure, light-blocking dummy patterns are added on touch electrodes of the display panel in a display device in a touch input system, the light reflectance of the display panel is reduced. Accordingly, the recognition rate and accuracy of code patterns and code information can be improved.

It should be noted that effects of the present disclosure are not limited to those described above and other effects of the present disclosure will be apparent to those skilled in the art from the following descriptions.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

As used herein, the word "or" means logical "or" so, unless the context indicates otherwise, the expression "A, B, or C" means "A and B and C," "A and B but not C," "A and C but not B," "B and C but not A," "A but not B and not C," "B but not A and not C," and "C but not A and not B."

Hereinafter, embodiments of the present disclosure will be described with reference to the accompanying drawings.

Figure 1:
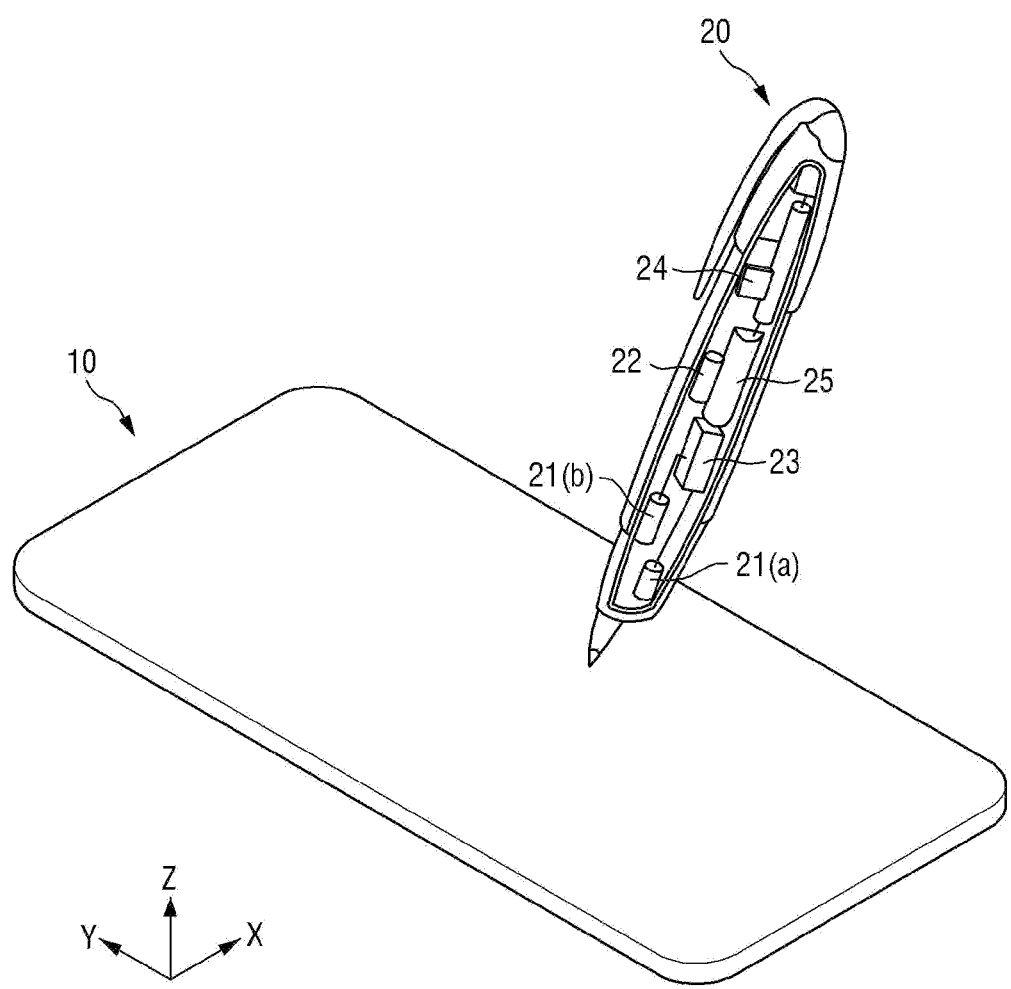
FIG. 1 is a view showing a configuration of a touch input system according to an embodiment of the present disclosure.
Figure 2:
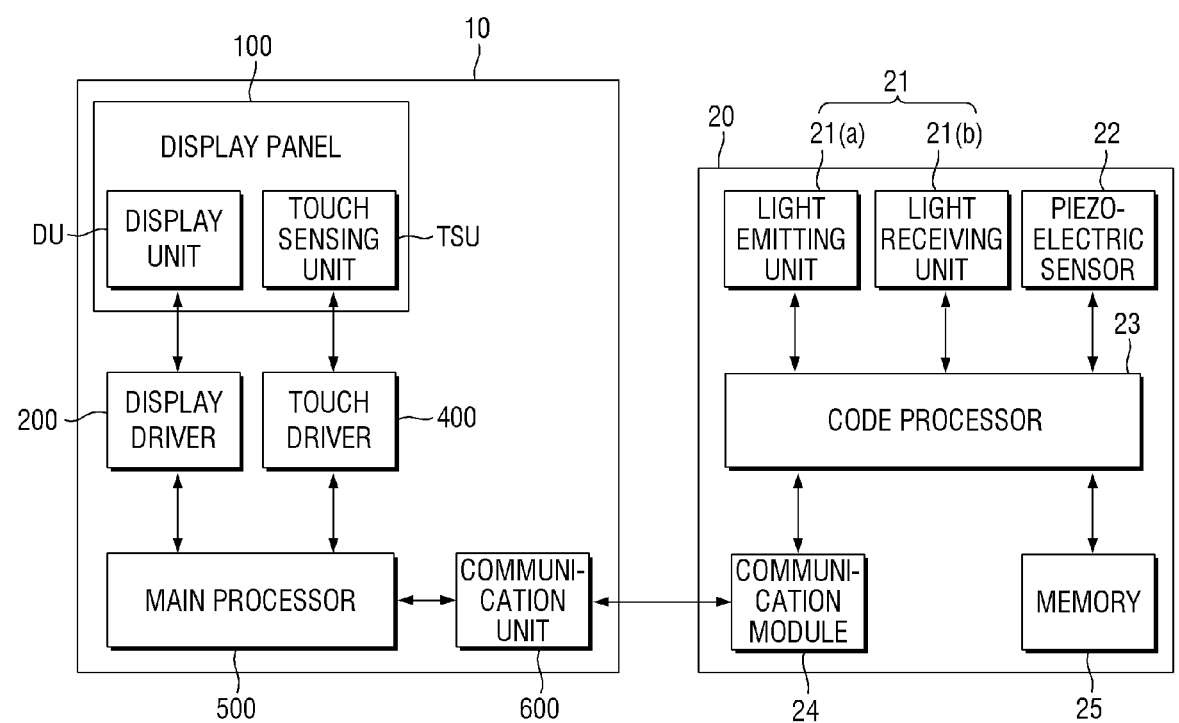
FIG. 2 is a block diagram of a touch input device and a display device shown in FIG. 1.

FIG. 1 is a view showing a configuration of a touch input system according to an embodiment of the present disclosure. FIG. 2 is a block diagram of a touch input device and a display device shown in FIG. 1.

Referring to FIGS. 1 and 2, a display device 10 may be employed by portable electronic devices such as a mobile phone, a smart phone, a tablet PC, a mobile communications terminal, an electronic notebook, an electronic book, a portable multimedia player (PMP), a navigation device and an ultra mobile PC (UMPC). For example, the display device 10 may be used as a display unit of a television, a laptop computer, a monitor, an electronic billboard, or the Internet of Things (JOT). For another example, the display device 10 may be applied to wearable devices such as a smart watch, a watch phone, a glasses-type display, and a head-mounted display (HMD) device.

The display device 10 includes a display panel 100, a display driver 200, a touch driver 400, a main processor 500, and a communications unit 600. A touch input device 20 includes a code detector 21, a piezoelectric sensor 22, a code processor 23, a communications module 24, and a memory 25.

The display device 10 uses the touch input device 20 as a touch input tool. The display panel 100 of the display device 10 may include a display unit DU displaying images, and a touch sensing unit TSU sensing a part of a human body such as a finger and the touch input device 20.

The display unit DU of the display panel 100 may include a plurality of pixels and may display images through the plurality of pixels. The touch sensing unit TSU of the display panel 100 may be formed on the front side of the display panel 100. The touch sensing unit TSU may include a plurality of touch electrodes to sense a user's touch by capacitive sensing. Code patterns are formed on some of the plurality of touch electrodes, so that the code patterns are sensed by the touch input device 20.

The code patterns of the display panel 100 are formed of light-blocking members that form a predetermined plane code shape by covering some of the plurality of touch electrodes with a predetermined area. Accordingly, the code patterns are sensed by the touch input device 20 according to the plane code shape of the light-blocking members and the size of the plane code. Light-blocking dummy patterns are formed on some of the front surfaces of the plurality of touch electrodes on which the code patterns are not formed such that what appears below the light-blocking dummy patterns do not appear to be code patterns. That is to say, code patterns are formed and disposed on a part of the front surfaces of some of the plurality of touch electrodes at predetermined spacing. In addition, light-blocking dummy patterns that block infrared or ultraviolet light without being sensed by the touch input device 20 are formed in a variety of predetermined shapes on a part of the front surfaces of the touch electrodes on which the code patterns are not formed. The light-blocking dummy patterns may reduce the exposed area of the touch electrodes to thereby reduce the reflective characteristics and reflectance of the touch electrodes. In this manner, it is possible to reduce the influence of ambient reflected light to thereby increase the recognition rate and the accuracy of the code patterns of the touch input device 20. The structures of the code patterns and the dummy patterns including the touch sensing unit TSU of the display panel 100 will be described in more detail later with reference to the accompanying drawings.

The display driver 200 may output signals and voltages for driving the display unit DU. The display driver 200 may supply data voltages to data lines. The display driver 200 may apply a supply voltage to a voltage line and may supply gate control signals to the gate driver.

The touch driver 400 may be connected to the touch sensing unit TSU. The touch driver 400 may supply a touch driving signal to a plurality of touch electrodes of the touch sensing unit TSU and may sense a change in the capacitance between the plurality of touch electrodes. The touch driver 400 may determine whether a user's touch is input and may find the coordinates of the touch based on the amount of the change in the capacitance between the touch electrodes.

The main processor 500 may control all the functions of the display device 10. For example, the main processor 500 may apply digital video data to the display driver 200 so that the display panel 100 displays images. For example, the main processor 500 may receive touch data from the touch driver 400 to determine the coordinates of the user's touch, and then may generate digitizer video data based on the coordinates or may execute an application indicated by the icon displayed at the coordinates of the user's touch. For another example, the main processor 500 may receive coordinate data from the touch input device 20 to determine the coordinates of the touch input device 20, and then may generate digitizer video data based on the coordinates or may execute an application indicated by the icon displayed at the touch coordinates of the touch input device 20.

The communications unit 600 may conduct wired/wireless communications with an external device. For example, the communications unit 600 may transmit/receive communication signals to/from the communications module 24 of the touch input device 20. The communications unit 600 may receive coordinate data composed of data codes from the touch input device 20 and may provide the coordinate data to the main processor 500.

The touch input device 20 may be used as a touch input tool and may be implemented as an electronic pen such as a smart pen. The touch input device 20 is an electronic pen that optically senses display light of the display panel 100 or light reflected off the display panel 100. The touch input device 20 may detect code patterns included in the display panel 100 based on the sensed light and generate coordinate data. The touch input device 20 may be, but is not limited to, an electronic pen in the shape of a writing tool.

The code detector 21 of the touch input device 20 is disposed adjacent to the pen tip of the touch input device 20 to sense code patterns included in the display panel 100. To this end, the code detector 21 includes at least one light-outputting portion 21(a) for outputting infrared light using at least one infrared light source, and at least one light-receiving portion 21(b) for detecting infrared light reflected off the code patterns with an infrared camera.

The at least one infrared light source included in the light-outputting portion 21(a) may be configured as an infrared LED array in a matrix pattern. The infrared camera of the light-receiving portion 21(b) may include a filter that transmits infrared rays and blocks wavelength ranges other than infrared rays, a lens system for focusing the infrared rays having transmitted the filter, and an optical image sensor that converts the optical image formed by the lens system into an electrical image signal and outputs it, etc. The optical image sensor is configured as an array in a matrix pattern like the infrared LED array, and may provide shape data of the code patterns to the code processor 23 according to the infrared shape reflected from the code patterns. In this manner, the code detector 21 of the touch input device 20 continuously detects code patterns included in some regions of the touch sensing unit TSU according to the user's control and motion, and may continuously generate the shape data of the code patterns to provide it to the code processor 23.

The code processor 23 may continuously receive shape data of code patterns from the code detector 21. For example, the code processor 23 may continuously receive shape data for the code patterns, and may identify the arrangement structure and shape of the code patterns. The code processor 23 may extract or generate data codes corresponding to the arrangement structure and shape of the code patterns, and may combine the data codes to extract or generate coordinate data corresponding to the combined data codes. The code processor 23 may transmit the generated coordinate data to the display device 10 through the communications module 24. In particular, the code processor 23 receives the shape data of the code patterns and generates data codes corresponding to the code patterns to convert them, so that coordinate data can be quickly generated without complicated calculation or correction.

The communications module 24 may conduct wired/wireless communications with an external device. For example, the communications module 24 may transmit/receive communication signals to/from the communications unit 600 of the display device 10. The communications module 24 may receive coordinate data composed of data codes from the code processor 23 and may provide the coordinate data to the communications unit 600.

The memory 25 may store data necessary for driving the touch input device 20. The memory 25 stores shape data of the code patterns and data codes respectively corresponding to the shape data and the code patterns. In addition, the memory 25 stores data codes and coordinate data according to the combination of data codes. The memory 25 shares with the code processor 23 the data codes corresponding to respective shape data and code patterns, and coordinate data according to the combination of data codes. Accordingly, the code processor 23 may combine the data codes through the data codes and the coordinate data stored in the memory 25, and may extract or generate coordinate data corresponding to the combined data codes.

Figure 3:
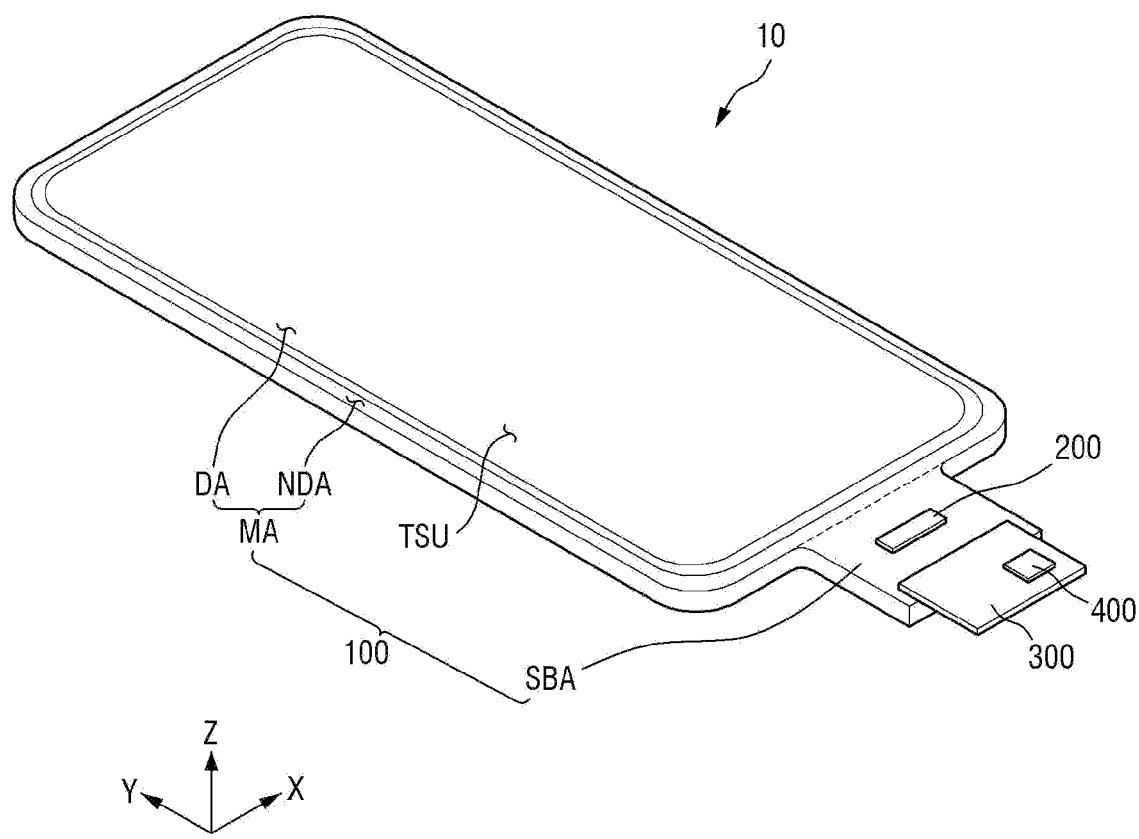
FIG. 3 is a perspective view showing the configuration of the display device shown in FIG. 2.
Figure 4:
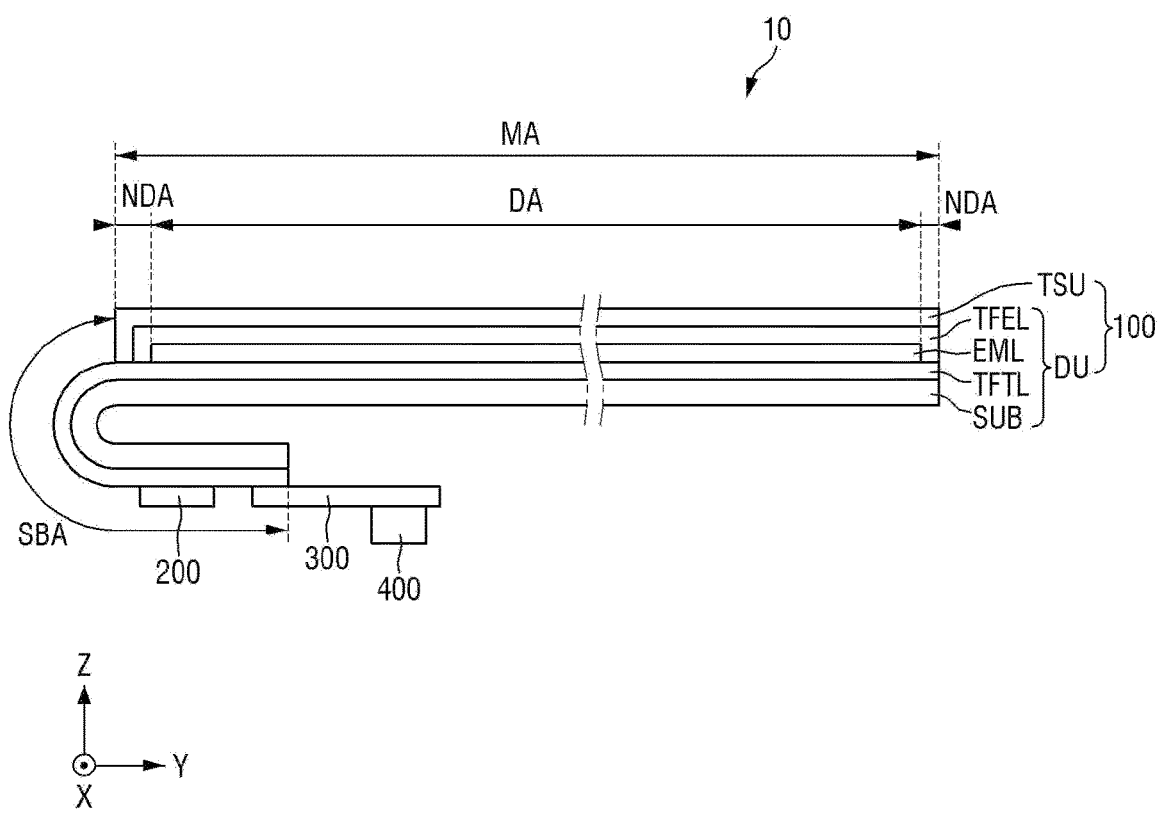
FIG. 4 is a cross-sectional view showing the configuration of the display device shown in FIG. 2.

FIG. 3 is a perspective view showing the configuration of the display device shown in FIG. 2. FIG. 4 is a cross-sectional view showing the configuration of the display device shown in FIG. 2.

Referring to FIGS. 3 and 4, the display device 10 may have a shape similar to a quadrangle when viewed from the top. For example, the display device 10 may have a shape similar to a quadrangle having shorter sides in the x-axis direction and longer sides in the y-axis direction when viewed from the top. The corners where the shorter sides in the x-axis direction and the longer sides in the y-axis direction meet may be rounded to have a predetermined curvature or may be formed at a right angle. The shape of the display device 10 when viewed from the top is not limited to a quadrangular shape, but may be formed in a shape similar to other polygonal shapes, a circular shape, or an elliptical shape.

The display panel 100 may include a main area MA and a subsidiary area SBA.

The main area MA may include a display area DA having pixels for displaying images, and a non-display area NDA located around the display area DA. The display area DA may emit light from a plurality of emission areas or a plurality of opening areas. For example, the display panel 100 may include a pixel circuit including switching elements, a pixel-defining layer that defines the emission areas or the opening areas, and a self-light-emitting element.

The non-display area NDA may be disposed on the outer side of the display area DA. The non-display area NDA may be defined as the edge area of the main area MA of the display panel 100. The non-display area NDA may include a gate driver (not shown) that applies gate signals to gate lines, and fan-out lines (not shown) that connect the display driver 200 with the display area DA.

The subsidiary area SBA may be extended from one side of the main area MA. The subsidiary area SUB may include a flexible material that can be bent, folded, or rolled. For example, when the subsidiary area SBA is bent, the subsidiary area SBA may overlap the main area MA in the thickness direction (z-axis direction). The subsidiary area SBA may include pads connected to the display driver 200 and the circuit board 300. Optionally, the subsidiary area SBA may be eliminated, and the display driver 200 and the pads may be disposed in the non-display area NDA.

The display driver 200 may be implemented as an integrated circuit (IC) and may be attached on the display panel 100 by a chip-on-glass (COG) technique, a chip-on-plastic (COP) technique, or ultrasonic bonding. For example, the display driver 200 may be disposed in the subsidiary area SBA and may overlap with the main area MA in the thickness direction (z-axis direction) when the subsidiary area SBA is bent. For another example, the display driver 200 may be mounted on the circuit board 300.

The circuit board 300 may be attached on the pads of the display panel 100 using an anisotropic conductive film (ACF). Lead lines of the circuit board 300 may be electrically connected to the pads of the display panel 300. The circuit board 300 may be a flexible printed circuit board (FPCB), a printed circuit board (PCB), or a flexible film such as a chip-on-film (COF).

The touch driver 400 may be mounted on the circuit board 300. The touch driver 400 may be implemented as an integrated circuit (IC). As described above, the touch driver 400 may supply a touch driving signal to a plurality of touch electrodes of the touch sensing unit TSU and may sense a change in the capacitance between the plurality of touch electrodes. The touch driving signal may be a pulse signal having a predetermined frequency. The touch driver 400 may determine whether there is touch by a part of a user's body such as a finger and may find the coordinates of the touch, if any, based on the amount of the change in the capacitance between the touch electrodes.

Referring to FIG. 4, the display panel 100 may include a display unit DU, a touch sensing unit TSU, and a polarizing film (not shown). The display unit DU may include a substrate SUB, a thin-film transistor layer TFTL, an emission material layer EML and an encapsulation layer TFEL.

The substrate SUB may be a base substrate or a base member. The substrate SUB may be a flexible substrate that can be bent, folded, or rolled. For example, the substrate SUB may include, but is not limited to, a glass material or a metal material. As another example, the substrate SUB may include a polymer resin such as polyimide.

The thin-film transistor layer TFTL may be disposed on the substrate SUB. The thin-film transistor layer TFTL may include a plurality of thin-film transistors forming pixel circuits of pixels. The thin-film transistor layer TFTL may include gate lines, data lines, voltage lines, gate control lines, fan-out lines for connecting the display driver 200 with the data lines, lead lines for connecting the display driver 200 with the pads, etc. When the gate driver is formed on one side of the non-display area NDA of the display panel 100, the gate driver may include thin-film transistors.

The thin-film transistor layer TFTL may be disposed in the display area DA, the non-display area NDA and the subsidiary area SBA. The thin-film transistors in each of the pixels, the gate lines, the data lines and the voltage lines in the thin-film transistor layer TFTL may be disposed in the display area DA. The gate control lines and the fan-out lines in the thin-film transistor layer TFTL may be disposed in the non-display area NDA. The lead lines of the thin-film transistor layer TFTL may be disposed in the subsidiary area SBA.

The emission material layer EML may be disposed on the thin-film transistor layer TFTL. The emission material layer EML may include a plurality of light-emitting elements in each of which a first electrode, an emissive layer and a second electrode are stacked on one another sequentially to emit light, and a pixel-defining layer for defining the pixels. The plurality of light-emitting elements in the emission material layer EML may be disposed in the display area DA. The emissive layer may be an organic emissive layer containing an organic material. The emissive layer may include a hole transporting layer, an organic light-emitting layer and an electron transporting layer. When the first electrode receives a voltage and the second electrode receives a cathode voltage through the thin-film transistors on the thin-film transistor layer TFTL, the holes and electrons may move to the organic light-emitting layer through the hole transporting layer and the electron transporting layer, respectively, such that they combine in the organic light-emitting layer to emit light. For example, the first electrode may be an anode electrode while the second electrode may be a cathode electrode. It is, however, to be understood that the present disclosure is not limited thereto.

For another example, the plurality of light-emitting elements may include quantum-dot light-emitting diodes including a quantum-dot emissive layer or inorganic light-emitting diodes including an inorganic semiconductor.

The encapsulation layer TFEL may cover the upper and side surfaces of the emission material layer EML, and can protect the emission material layer EML. The encapsulation layer TFEL may include at least one inorganic layer and at least one organic layer for encapsulating the emission material layer EML.

The touch sensing unit TSU may be disposed on the encapsulation layer TFEL. The touch sensing unit TSU may include a plurality of touch electrodes for sensing a user's touch by capacitive sensing, and touch lines connecting the plurality of touch electrodes with the touch driver 400. For example, the touch sensor unit TSU may sense a user's touch by self-capacitance sensing or mutual capacitance sensing.

For another example, the touch sensing unit TSU may be disposed on a separate substrate disposed on the display unit DU. In such case, the substrate supporting the touch sensing unit TSU may be a base member encapsulating the display unit DU.

The plurality of touch electrodes of the touch sensing unit TSU may be disposed in a touch sensor area overlapping the display area DA. The touch lines of the touch sensing unit TSU may be disposed in a touch peripheral area overlapping the non-display area NDA.

The subsidiary area SBA of the display panel 100 may be extended from one side of the main area MA. The subsidiary area SUB may include a flexible material that can be bent, folded, or rolled. For example, when the subsidiary area SBA is bent, the subsidiary area SBA may overlap the main area MA in the thickness direction (z-axis direction). The subsidiary area SBA may include pads connected to the display driver 200 and the circuit board 300.

Figure 5:
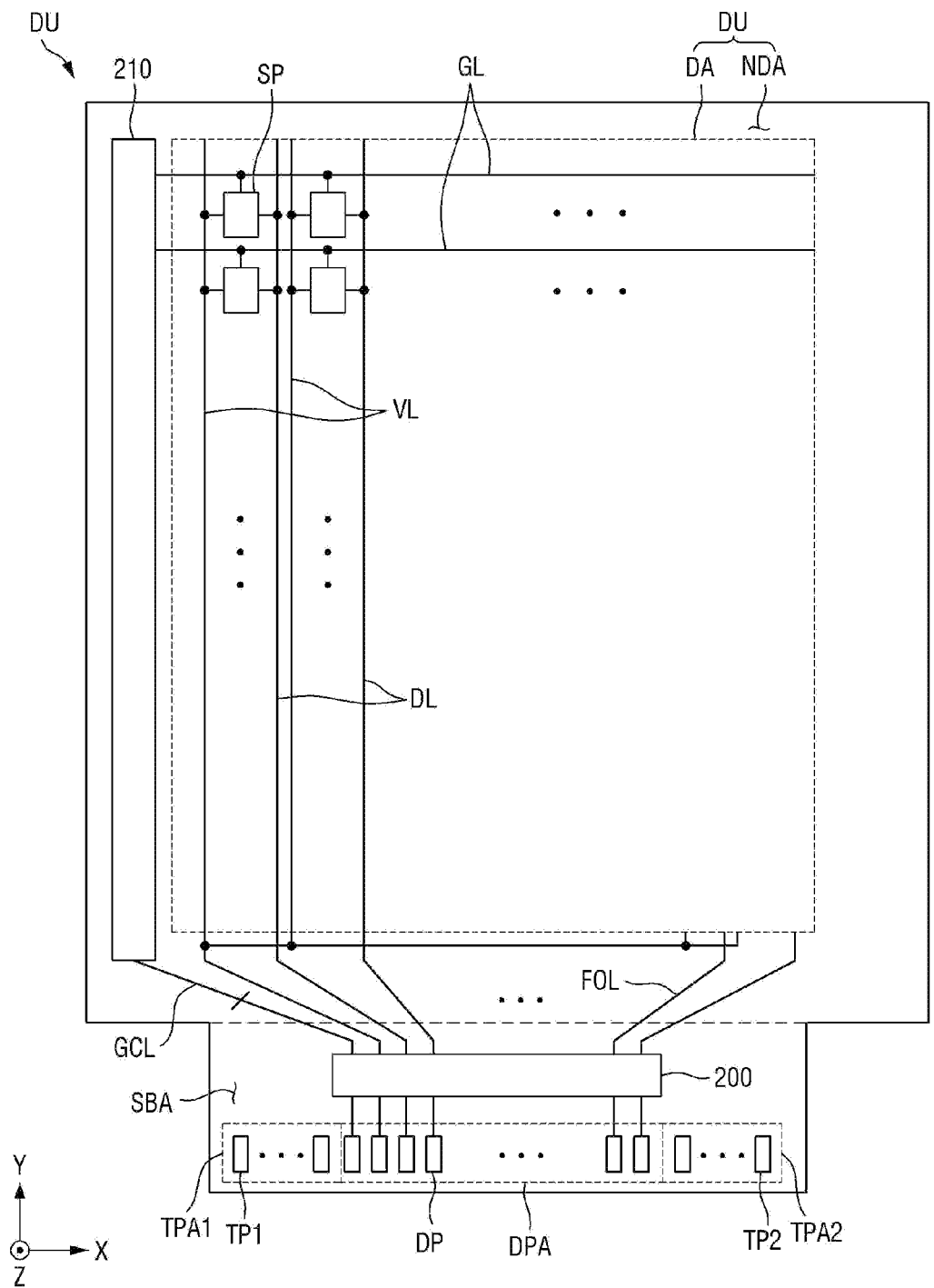
FIG. 5 is a plan view showing a display unit of a display device according to an embodiment of the present disclosure.

FIG. 5 is a plan view showing a display unit of a display device according to an embodiment of the present disclosure.

Referring to FIG. 5, the display area DA of the display unit DU may display images and may be defined as a central area of the display panel 100. The display area DA may include a plurality of pixels SP, a plurality of gate lines GL, a plurality of data lines DL and a plurality of voltage lines VL. Each of the plurality of pixels SP may be defined as the minimum unit that outputs light.

The plurality of gate lines GL may supply the gate signals received from the gate driver 210 to the plurality of pixels SP. The plurality of gate lines GL may be extended in the x-axis direction and may be spaced apart from one another in the y-axis direction crossing the x-axis direction.

The plurality of data lines DL may supply the data voltages received from the display driver 200 to the plurality of pixels SP. The plurality of data lines DL may be extended in the y-axis direction and may be spaced apart from one another in the x-axis direction.

The plurality of voltage lines VL may supply the supply voltage received from the display driver 200 to the plurality of pixels SP. The supply voltage may be at least one of a driving voltage, an initialization voltage, and a reference voltage. The plurality of voltage lines VL may be extended in the y-axis direction and may be spaced apart from one another in the x-axis direction.

The non-display area NDA of the display unit DU may surround the display area DA. The non-display area NDA may include the gate driver 210, fan-out lines FOL, and gate control lines GCL. The gate driver 210 may generate a plurality of gate signals based on the gate control signal, and may sequentially supply the plurality of gate signals to the plurality of gate lines GL in a predetermined order.

The fan-out lines FOL may be extended from the display driver 200 to the display area DA. The fan-out lines FOL may supply the data voltage received from the display driver 200 to the plurality of data lines DL.

A gate control line GCL may be extended from the display driver 200 to the gate driver 210. The gate control line GCL may supply the gate control signal received from the display driver 200 to the gate driver 210.

The subsidiary area SBA may include the display driver 200, the display pad area DPA, and first and second touch pad areas TPA1 and TPA2.

The display driver 200 may output signals and voltages for driving the display panel 100 to the fan-out lines FOL. The display driver 200 may supply data voltages to the data lines DL through the fan-out lines FOL. The data voltages may be applied to the plurality of pixels SP, so that the luminance of the plurality of pixels SP may be determined. The display driver 200 may supply a gate control signal to the gate driver 210 through the gate control line GCL.

The display pad area DPA, the first touch pad area TPA1 and the second touch pad area TPA2 may be disposed on the edge of the subsidiary area SBA. The display pad area DPA, the first touch pad area TPA1 and the second touch pad area TPA2 may be electrically connected to the circuit board 300 using a low-resistance, high-reliability material such as an anisotropic conductive film and a SAP.

The display pad area DPA may include a plurality of display pads DP. The plurality of display pads DP may be connected to the main processor 500 through the circuit board 300. The plurality of display pads DP may be connected to the circuit board 300 to receive digital video data and may supply digital video data to the display driver 200.

Figure 6:
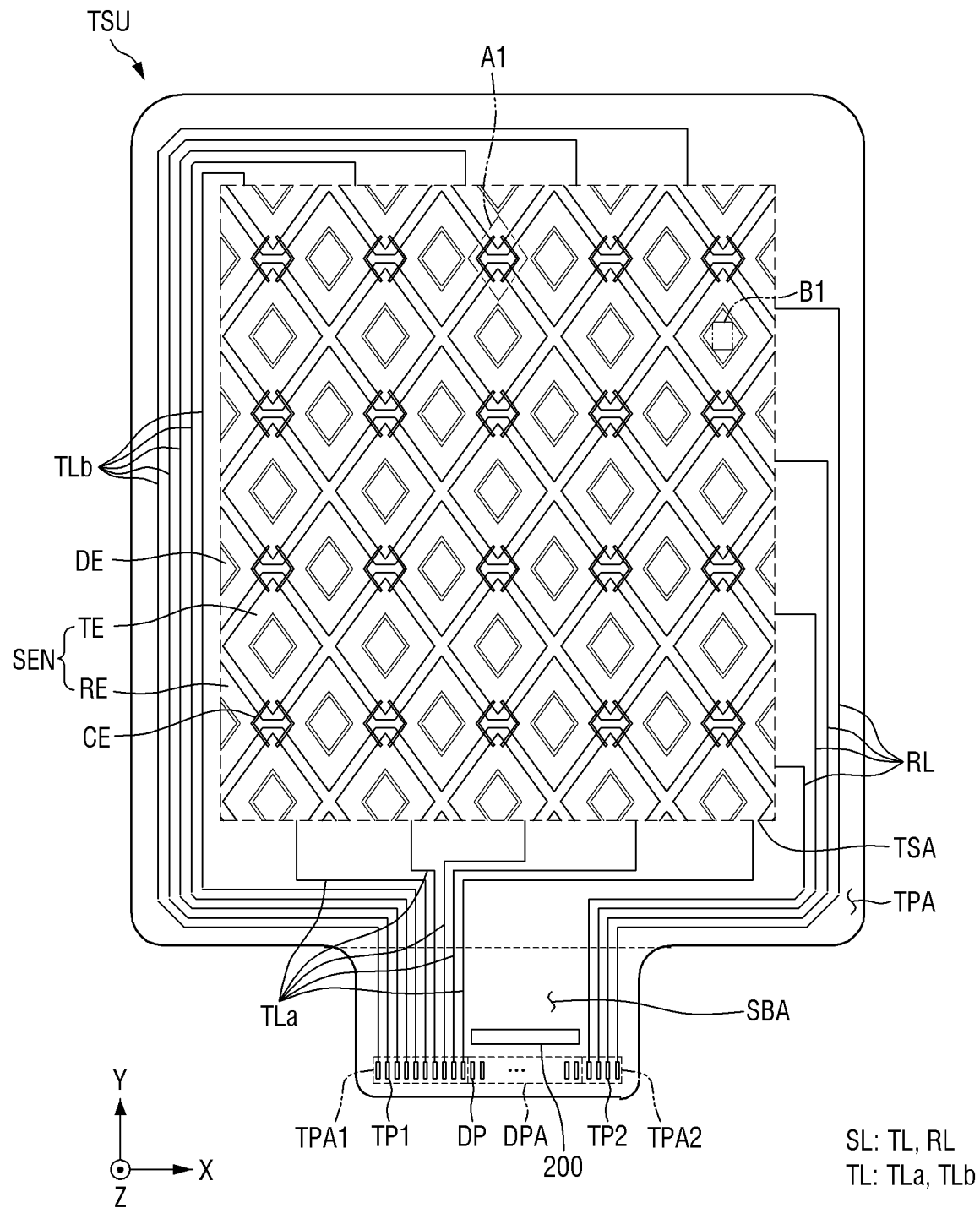
FIG. 6 is a plan view showing a touch sensing unit of a display device according to an embodiment of the present disclosure.

FIG. 6 is a plan view showing a touch sensing unit of a display device according to an embodiment of the present disclosure.

Referring to FIG. 6, the touch sensing unit TSU may include a touch sensor area TSA that senses a user's touch, and a touch peripheral area TPA disposed around the touch sensor area TSA. The touch sensor area TSA may overlap the display area DA of the display unit DU, and the touch peripheral area TPA may overlap the non-display area NDA of the display unit DU.

The touch sensor area TSA may include a plurality of touch electrodes SEN and a plurality of dummy electrodes DE. The plurality of touch electrodes SEN may form mutual capacitance or self capacitance to sense a touch of an object or person. The plurality of touch electrodes SEN may include a plurality of driving electrodes TE and a plurality of sensing electrodes RE.

The plurality of driving electrodes TE may be arranged in the x-axis direction and the y-axis direction. The plurality of driving electrodes TE may be spaced apart from one another in the x-axis direction and the y-axis direction. The driving electrodes TE adjacent in the y-axis direction may be electrically connected through a plurality of connection electrodes CE.

The plurality of driving electrodes TE may be connected to first touch pads TP1 through driving lines TL. The driving lines TL may include lower driving lines TLa and upper driving lines TLb. For example, some of the driving electrodes TE disposed on the lower side of the touch sensor area TSA may be connected to the first touch pads TP1 through the lower driving lines TLa, and some others of the driving electrodes TE disposed on the upper side of the touch sensor area TSA may be connected to the first touch pads TP1 through the upper driving lines TLb. The lower driving lines TLa may be extended to the first touch pads TP1 beyond the lower side of the touch peripheral area TPA. The upper driving lines TLb may be extended to the first touch pads TP1 via the upper side, the left side and the lower side of the touch peripheral area TPA. The first touch pads TP1 may be connected to the touch driver 400 through the circuit board 300.

The connection electrodes CE may be bent at least once. Although the connection electrodes CE may have the shape of an angle bracket "<" or ">", the shape of the connection electrodes CE when viewed from the top is not limited thereto. The driving electrodes TE adjacent to one another in the y-axis direction may be electrically connected by the plurality of connection electrodes CE. Even if one of the connection electrodes CE is disconnected, the driving electrodes TE can be stably connected through the remaining connection electrodes CE. The driving electrodes TE adjacent to each other may be connected by two connection electrodes CE, but the number of connection electrodes CE is not limited thereto.

The connection electrodes CE may be disposed on a different layer from the plurality of driving electrodes TE and the plurality of sensing electrodes RE. The sensing electrodes RE adjacent to one another in the x-axis direction may be electrically connected to one another through connection portions disposed on the same layer as the plurality of driving electrodes TE or the plurality of sensing electrodes RE. In other words, the plurality of sensing electrodes RE may be extended in the x-axis direction and may be spaced apart from one another in the y-axis direction. The plurality of sensing electrodes RE may be arranged in the x-axis direction and the y-axis direction, and the sensing electrodes RE adjacent to one another in the x-axis direction may be electrically connected through the connection portions.

The driving electrodes TE adjacent to one another in the y-axis direction may be electrically connected through the connection electrodes CE disposed on a different layer from the plurality of driving electrodes TE or the plurality of sensing electrodes RE. The connection electrodes CE may be formed on the rear layer (or the lower layer) of the layer on which the driving electrodes TE and the sensing electrodes RE are formed. The connection electrodes CE are electrically connected to the driving electrode TE through a plurality of contact holes. Accordingly, even though the connection electrodes CE overlap with the plurality of sensing electrodes RE in the z-axis direction, the plurality of driving electrodes TE and the plurality of sensing electrodes RE can be insulated from each other. Mutual capacitance may be formed between the driving electrodes TE and the sensing electrodes RE.

The plurality of sensing electrodes RE may be connected to second touch pads TP2 through sensing lines RL. For example, some of the sensing electrodes RE disposed on the right side of the touch sensor area TSA may be connected to the second touch pads TP2 through the sensing lines RL. The sensing lines RL may be extended to the second touch pads TP2 through the right side and the lower side of the touch peripheral area TPA. The second touch pads TP2 may be connected to the touch driver 400 through the circuit board 300.

Each of the plurality of dummy electrodes DE may be surrounded by the driving electrode TE or the sensing electrode RE. Each of the plurality of dummy electrodes DE may be spaced apart from and insulated from the driving electrode TE or the sensing electrode RE. Accordingly, the dummy electrodes DE may be electrically floating.

Code patterns in the plane code shape are formed at predetermined spacing on some regions of the front surface of at least one of the plurality of driving electrodes TE, the plurality of sensing electrodes RE, and the plurality of dummy electrodes DE. Light-blocking dummy patterns are formed on some of the front surfaces of the plurality of touch electrodes on which the code patterns are not formed such that they do not overlap with the code patterns.

The display pad area DPA, the first touch pad area TPA1 and the second touch pad area TPA2 may be disposed on the edge of the subsidiary area SBA. The display pad area DPA, the first touch pad area TPA1 and the second touch pad area TPA2 may be electrically connected to the circuit board 300 using a low-resistance, high-reliability material such as an anisotropic conductive film and a SAP.

The first touch pad area TPA1 may be disposed on one side of the display pad area DPA and may include a plurality of first touch pads TP1. The plurality of first touch pads TP1 may be electrically connected to the touch driver 400 disposed on the circuit board 300. The plurality of first touch pads TP1 may supply touch driving signals to the plurality of driving electrodes TE through the plurality of driving lines TL.

The second touch pad area TPA2 may be disposed on the opposite side of the display pad area DPA and may include a plurality of second touch pads TP2. The plurality of second touch pads TP2 may be electrically connected to the touch driver 400 disposed on the circuit board 300. The touch driver 400 may receive a touch sensing signal through the plurality of sensing lines RL connected to the plurality of second touch pads TP2, and may sense a change in the capacitance between the driving electrodes TE and the sensing electrodes RE.

As another example, the touch driver 400 may supply a touch driving signal to each of the plurality of driving electrodes TE and the plurality of sensing electrodes RE, and may receive a touch sensing signal from each of the plurality of driving electrodes TE and the plurality of sensing electrodes RE. The touch driver 400 may sense a change in the amount of charges in each of the plurality of driving electrodes TE and the plurality of sensing electrodes RE based on the touch sensing signal.

Figure 7:
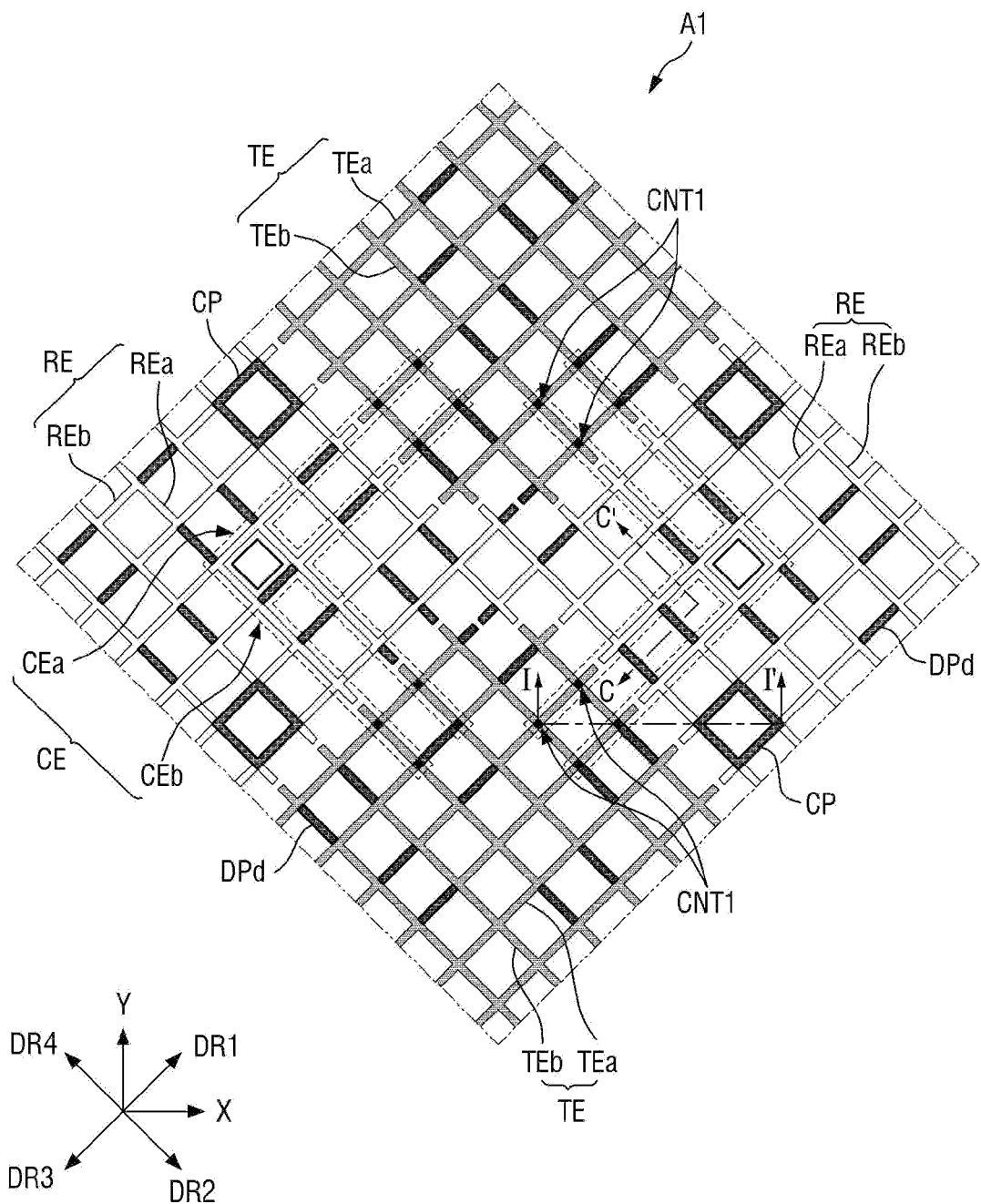
FIG. 7 is an enlarged view of area A1 shown in FIG. 6.
Figure 8:
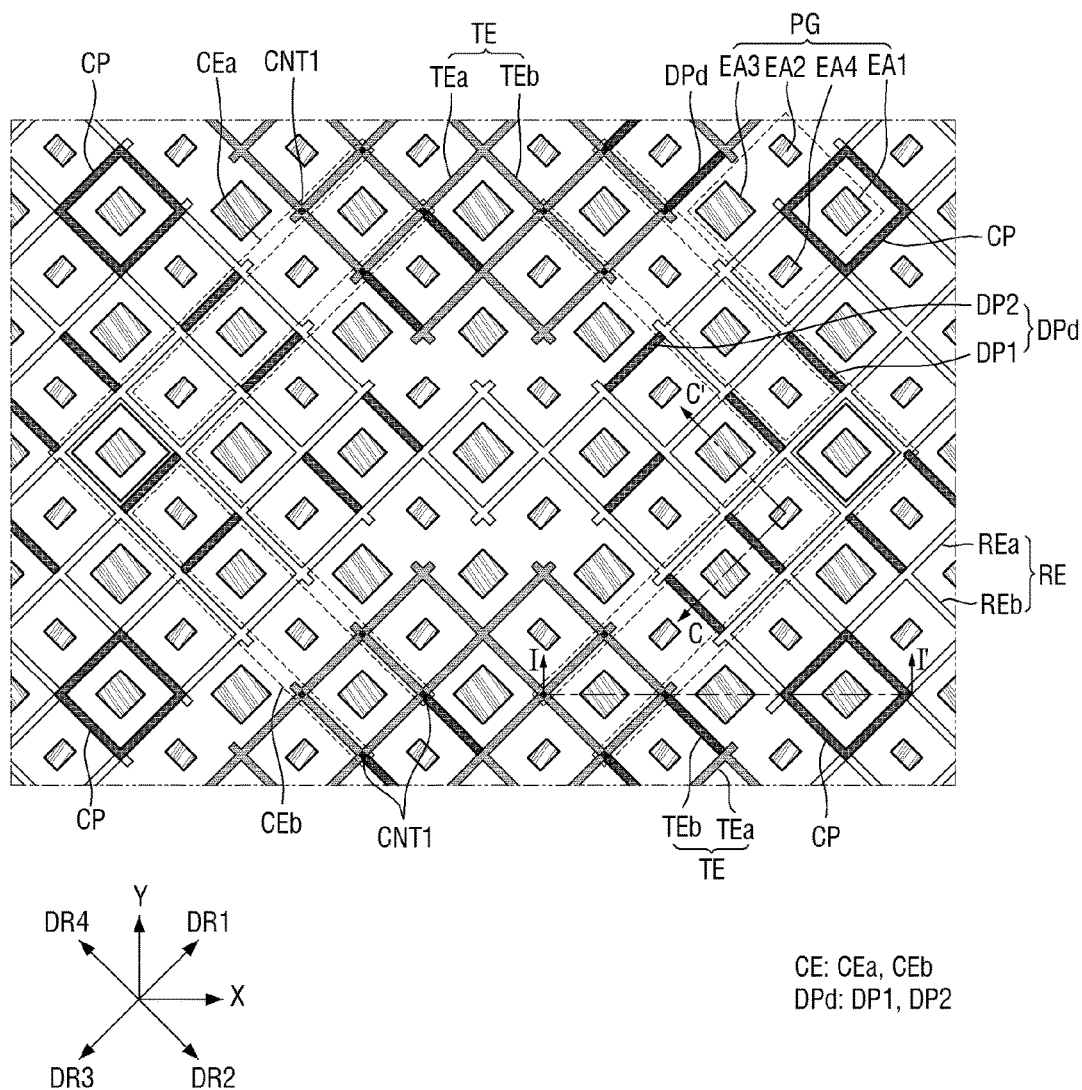
FIG. 8 is an enlarged view showing area A1 in which code patterns and light-blocking dummy patterns are disposed according to an embodiment.

FIG. 7 is an enlarged view of area A1 shown in FIG. 6. FIG. 8 is an enlarged view showing area A1 in which code patterns and light-blocking dummy patterns are disposed according to an embodiment.

Referring to FIGS. 7 and 8, a plurality of driving electrodes TE and a plurality of sensing electrodes RE may be disposed on the same layer and may be spaced apart from one another.

The plurality of driving electrodes TE may be arranged in the x-axis direction and the y-axis direction. The plurality of driving electrodes TE may be spaced apart from one another in the x-axis direction and the y-axis direction. The driving electrodes TE adjacent in the y-axis direction may be electrically connected through a plurality of connection electrodes CE.

The plurality of sensing electrodes RE may be extended in the x-axis direction and may be spaced apart from one another in the y-axis direction. The plurality of sensing electrodes RE may be arranged in the x-axis direction and the y-axis direction, and the sensing electrodes RE adjacent to one another in the x-axis direction may be electrically connected. For example, the sensing electrodes RE may be electrically connected through connection portions, and the connection portions may be disposed within the shortest distance between the driving electrodes TE adjacent to each other.

The connection electrodes CE may be disposed on a different layer from the plurality of driving electrodes TE and the plurality of sensing electrodes RE, e.g., a rear surface layer. Each of the connection electrodes CE may include a first portion CEa and a second portion CEb. For example, the first portion CEa of the connection electrode CE may be connected to the driving electrode TE disposed on one side through a first contact hole CNT1 and may be extended in the third direction DR3. The second portion CEb of the connection electrode CE may be bent from the first portion CEa where it overlaps the sensing electrode RE to be extended in the second direction DR2, and may be connected to the driving electrode TE disposed on the other side through the first contact hole CNT1. In the following description, the first direction DR1 may be a direction between the x-axis direction and the y-axis direction, the second direction DR2 may be a direction between the direction opposite to the y-axis direction and the x-axis direction, and the third direction DR3 may be the direction opposite to the first direction DR1, and a fourth direction DR4 may be the direction opposite to the second direction DR2. Accordingly, each of the plurality of connection electrodes CE may connect the adjacent driving electrodes TE in the y-axis direction.

The plurality of pixels may include first to third sub-pixels or first to fourth sub-pixels. The first to fourth sub-pixels may include first to fourth emission areas EA1, EA2, EA3, and EA4, respectively. For example, the first emission area EA1 may emit light of a first color or red light, the second emission area EA2 may emit light of a second color or green light, and the third emission area EA3 may emit light of a third color or blue light. In addition, the fourth emission area EA4 may emit light of the fourth color or light of one of the first to third colors, but the present disclosure is not limited thereto.

One pixel group PG may represent black-and-white or grayscale image through the first to third emission areas EA1 to EA3 or the first to fourth emission areas EA1 to EA4. Grayscales of various colors, such as white, may be represented by combinations of light emitted from the first to third emission areas EA1 to EA3 or the first to fourth emission areas EA1 to EA4.

According to the arrangement structure of the first to third sub-pixels or the first to fourth sub-pixels, the plurality of driving electrodes TE and the plurality of sensing electrodes RE are formed in a mesh structure or a net structure when viewed from the top.

The plurality of driving electrodes TE and the plurality of sensing electrodes RE may surround the first to third emission areas EA1 to EA3 or the first to fourth emission areas EA1 to EA4 forming a pixel group PG when viewed from the top. Accordingly, the plurality of driving electrodes TE, the plurality of sensing electrodes RE may not overlap the first to fourth emission areas EA1 to EA4. The plurality of connection electrodes CE may not overlap with the first to fourth emission areas EA1 to EA4, either. Accordingly, the display device 10 can prevent the luminance of the light exiting from the first to fourth emission areas EA1, EA2, EA3 and EA4 from being lowered by the touch sensing unit TSU.

Each of the plurality of driving electrodes TE may include a first portion TEa extended in the first direction DR1 and a second portion TEb extended in the second direction DR2, so that it may not overlap with the first to fourth emission areas EA1 to EA4. Each of the plurality of sensing electrodes RE may include a first portion REa extended in the first direction DR1 and a second portion REb extended in the second direction DR2, so that it may not overlap with the first to fourth emission areas EA1 to EA4.

The code patterns CP are formed at predetermined spacing (e.g., approximately 300 μm) in some regions of the front surfaces of the plurality of driving electrodes TE and the plurality of sensing electrodes RE. In addition, the light-blocking dummy patterns DPd are formed in a variety of shapes in some other regions of the front surfaces of the plurality of driving electrodes TE and the plurality of sensing electrodes RE on which the code patterns CP are not formed such that they do not overlap with the code patterns CP.

The code patterns CP are formed of light-blocking members made of a material that absorbs light. Each of the light-blocking members is formed by covering some regions of the front surface of at least one of a plurality of driving electrodes TE and a plurality of sensing electrodes RE with a plane code shape of a predetermined size. They may be formed by covering not only some regions of the front surface of each of the electrodes but also at least one side surface along with the front surface.

The plane code shape of the code patterns CP may be formed in a closed loop shape such as a rectangle, a square, a circle and a diamond. Alternatively, the flat code shape of the code patterns CP may be formed in an open loop shape that surrounds only a part of one emission area. In addition, the plane code shape of the code patterns CP may be formed in a straight line shape or curved line shape having a predetermined length. On the other hand, when the code patterns CP surround both between and around the plurality of emission areas instead of one emission area, the overall shape of the code patterns CP may be formed in a mesh structure and a net structure when viewed from the top. Hereinafter, an example where the code patterns CP are formed in a diamond shape forming a closed loop when viewed from the top will be described.

The light-blocking dummy patterns DPd may be formed in peripheral regions of the code patterns CP so that they do not overlap with the code patterns CP. The light-blocking dummy patterns DPd are formed of light-blocking members made of a material that absorbs light. The code patterns CP may be disposed and formed irregularly in some regions of the front surfaces of the plurality of driving electrodes TE and the plurality of sensing electrodes RE on which the code patterns CP are not formed.

The light-blocking dummy patterns DPd may be made of the same material as that of the code patterns CP via the same process. That is to say, the light-blocking dummy patterns DPd may be formed together with the code patterns CP via the same process. In order to prevent the light-blocking dummy patterns DPd from being sensed as a code shape by the touch input device 20, they may be formed with different width, length, area and size from those of the code patterns CP.

The light-blocking dummy patterns DPd may be formed in a straight line or curved shape having a predetermined length, or may be formed in an open loop shape that is bent to partially surround at least one emission area. In addition, when the light-blocking dummy patterns DPd are formed to surround both between and around the emission areas instead of one emission area, the overall shape of the light-blocking dummy patterns DPd may be formed in mesh structure and a net structure when viewed from the top.

For example, as shown in FIG. 8, the light-blocking dummy patterns DPd may include a plurality of first dummy patterns DP1 that are formed in a straight line shape having a length different from that of the code patterns CP and are aligned in the second and fourth directions DR2 and DR4 which are first diagonal directions. In addition, the light-blocking dummy patterns DPd may include a plurality of second dummy patterns DP2 that are formed in a straight line shape having a length different from that of the code patterns CP and are aligned in the first and third directions DR1 and DR3 which are second diagonal directions such that they do not overlap with the first dummy patterns DP1. The first and second dummy patterns DP1 and DP2 may be arranged in the first and second diagonal directions such that they do not overlap each other according to the arrangement structure and shape of each pixel group PG and the first to fourth emission areas EA1 to EA4. Likewise, they may be arranged such that they do not overlap each other in the horizontal and vertical directions (x and y directions).

As such, the light-blocking dummy patterns DPd that block infrared and ultraviolet rays without being recognized as a code shape are formed on some regions of the front surfaces of the touch electrodes SEN on which the code patterns CP are not formed, so that the exposed areas of the touch electrodes SEN can be reduced. Accordingly, by reducing the reflective characteristics and reflectance of the touch electrodes SEN, the recognition rate and accuracy of the code patterns CP of the touch input device 20 can be increased.

Figure 9:
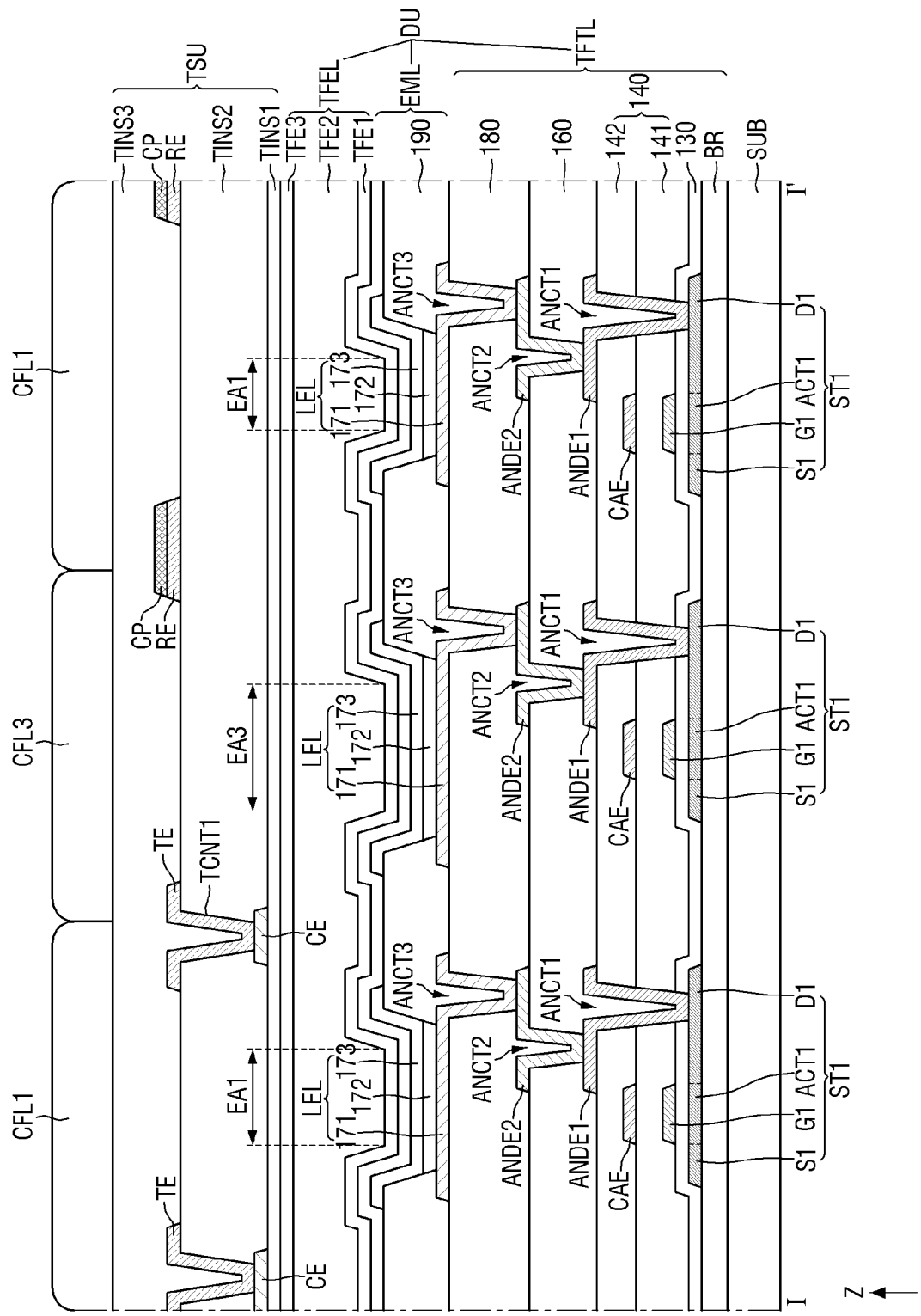
FIG. 9 is a cross-sectional view showing the cross-sectional structure, taken along line I-I' of FIGS. 7 and 8.

FIG. 9 is a cross-sectional view showing the cross-sectional structure, taken along line I-I' of FIGS. 7 and 8.

Referring to FIG. 9, a barrier layer BR may be disposed on the substrate SUB. The substrate SUB may be made of an insulating material such as a polymer resin. For example, the substrate SUB may be made of polyimide. The substrate SUB may be a flexible substrate that can be bent, folded, or rolled.

The barrier layer BR is a layer for protecting the thin-film transistors of the thin-film transistor layer TFTL and an emissive layer 172 of the emission material layer EML. The barrier layer BR may be formed of multiple inorganic layers stacked on one another alternately. For example, the barrier layer BR may be made up of multiple layers in which one or more inorganic layers of a silicon nitride layer, a silicon oxynitride layer, a silicon oxide layer, a titanium oxide layer and an aluminum oxide layer are alternately stacked on one another.

Thin-film transistors ST1 may be disposed on the barrier layer BR. Each of the thin-film transistors ST1 includes an active layer ACT1, a gate electrode G1, a source electrode S1, and a drain electrode D1.

The active layer ACT1, the source electrode S1 and the drain electrode D1 of each of the thin-film transistors ST1 may be disposed on the barrier layer BR. The active layer ACT1 of each of the thin-film transistors ST1 includes polycrystalline silicon, single crystalline silicon, low-temperature polycrystalline silicon, amorphous silicon, or an oxide semiconductor. A part of the active layer ACT1 overlapping the gate electrode G1 in the third direction (z-axis direction) that is the thickness direction of the substrate SUB may be defined as a channel region. The source electrode S1 and the drain electrode D1 are regions that do not overlap with the gate electrode G1 in the third direction (z-axis direction), and may have conductivity by doping ions or impurities into a silicon semiconductor or an oxide semiconductor.

A gate insulator 130 may be disposed on the active layer ACT1, the source electrode S1 and the drain electrode D1 of each of the thin-film transistors ST1. The gate insulator 130 may be formed of an inorganic layer, for example, a silicon nitride layer, a silicon oxynitride layer, a silicon oxide layer, a titanium oxide layer, or an aluminum oxide layer.

The gate electrode G1 of each of the thin-film transistors ST1 may be disposed on the gate insulator 130. The gate electrode G1 may overlap the active layer ACT1 in the third direction (z-axis direction). The gate electrode G1 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A first interlayer dielectric layer 141 may be disposed on the gate electrode G1 of each of the thin-film transistors ST1. The first interlayer dielectric layer 141 may be formed of an inorganic layer, for example, a silicon nitride layer, a silicon oxynitride layer, a silicon oxide layer, a titanium oxide layer, or an aluminum oxide layer. The first interlayer dielectric layer 141 may be made of a plurality of inorganic layers.

A capacitor electrode CAE may be disposed on the first interlayer dielectric layer 141. The capacitor electrode CAE may overlap the gate electrode G1 of the first thin-film transistor ST1 in the third direction (z-axis direction). Since the first interlayer dielectric layer 141 has a predetermined dielectric constant, a capacitor can be formed by the capacitor electrode CAE, the gate electrode G1, and the first interlayer dielectric layer 141 disposed between them. The capacitor electrode CAE may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A second interlayer dielectric layer 142 may be disposed over the capacitor electrode CAE. The second interlayer dielectric layer 142 may be formed of an inorganic layer, for example, a silicon nitride layer, a silicon oxynitride layer, a silicon oxide layer, a titanium oxide layer, or an aluminum oxide layer. The second interlayer dielectric layer 142 may be made of a plurality of inorganic layers.

A first anode connection electrode ANDE1 may be disposed on the second interlayer dielectric layer 142. The first anode connection electrode ANDE1 may be connected to the drain electrode D1 of the thin-film transistor ST1 through a first connection contact hole ANCT1 that penetrates the gate insulator 130, the first interlayer dielectric layer 141 and the second interlayer dielectric layer 142. The first anode connection electrode ANDE1 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A first planarization layer 160 may be disposed over the first anode connection electrode ANDE1 for providing a flat surface over level differences due to the thin-film transistor ST1. The first planarization layer 160 may be formed of an organic layer such as an acryl resin, an epoxy resin, a phenolic resin, a polyamide resin and a polyimide resin.

A second anode connection electrode ANDE2 may be disposed on the first planarization layer 160. The second anode connection electrode ANDE2 may be connected to the first anode connection electrode ANDE1 through a second connection contact hole ANCT2 penetrating the first planarization layer 160. The second anode connection electrode ANDE2 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A second planarization layer 180 may be disposed on the second anode connection electrode ANDE2. The second planarization layer 180 may be formed as an organic layer such as an acryl resin, an epoxy resin, a phenolic resin, a polyamide resin and a polyimide resin.

Light-emitting elements LEL and a bank 190 may be disposed on the second planarization layer 180. Each of the light-emitting elements LEL includes a pixel electrode 171, an emissive layer 172, and a common electrode 173.

The pixel electrode 171 may be disposed on the second planarization layer 180. The pixel electrode 171 may be connected to the second anode connection electrode ANDE2 through a third connection contact hole ANCT3 penetrating the second planarization layer 180.

In the top-emission structure in which light exits from the emissive layer 172 toward the common electrode 173, the pixel electrode 171 may be made of a metal material having a high reflectivity such as a stack structure of aluminum and titanium (Ti/Al/Ti), a stack structure of aluminum and indium tin oxide (ITO) (ITO/Al/ITO), an APC alloy and a stack structure of APC alloy and ITO (ITO/APC/ITO). The APC alloy is an alloy of silver (Ag), palladium (Pd) and copper (Cu).

The bank 190 may partition the pixel electrodes 171 on the second planarization layer 180 to define the first to third emission areas EA1 to EA3. The bank 190 may be disposed to cover the edges of the pixel electrodes 171. The bank 190 may be formed of an organic layer such as an acryl resin, an epoxy resin, a phenolic resin, a polyamide resin and a polyimide resin.

In each of the first to third emission areas EA1, EA2 and EA3, the pixel electrode 171, the emissive layer 172 and the common electrode 173 are stacked on one another sequentially, so that holes from the pixel electrode 171 and electrons from the common electrode 173 are combined with each other in the emissive layer 172 to emit light.

The emissive layer 172 may be disposed on the pixel electrode 171 and the bank 190. The emissive layer 172 may include an organic material to emit light of a certain color. For example, the emissive layer 172 may include a hole transporting layer, an organic material layer, and an electron transporting layer.

The common electrode 173 may be disposed on the emissive layer 172. The common electrode 173 may be disposed to cover the emissive layer 172. The common electrode 173 may be a common layer formed commonly across the first emission area EA1, the second emission area EA2, and the third emission area EA3. A capping layer may be formed on the common electrode 173.

In the top-emission organic light-emitting diode, the common electrode 173 may be formed of a transparent conductive material (TCP) such as ITO and IZO that can transmit light, or a semi-transmissive conductive material such as magnesium (Mg), silver (Ag) and an alloy of magnesium (Mg) and silver (Ag). When the common electrode 173 is formed of a semi-transmissive metal material, the light extraction efficiency can be increased by using microcavities.

An encapsulation layer TFEL may be disposed on the common electrode 173. The encapsulation layer TFEL includes at least one inorganic layer to prevent permeation of oxygen or moisture into the emission material layer EML. In addition, the encapsulation layer TFEL includes at least one organic layer to protect the light-emitting element layer EML from foreign substances such as dust. For example, the encapsulation layer TFEL includes a first inorganic encapsulation layer TFE1, an organic encapsulation layer TFE2 and a second inorganic encapsulation layer TFE3.

The first inorganic encapsulation layer TFE1 may be disposed on the common electrode 173, the organic encapsulation layer TFE2 may be disposed on the first inorganic encapsulation layer TFE1, and the second inorganic encapsulation layer TFE3 may be disposed on the organic encapsulation layer TFE2. The first inorganic encapsulation layer TFE1 and the second inorganic encapsulation layer TFE3 may be made up of multiple layers in which one or more inorganic layers of a silicon nitride layer, a silicon oxynitride layer, a silicon oxide layer, a titanium oxide layer and an aluminum oxide layer are alternately stacked on one another. The organic encapsulation layer TFE2 may be an organic layer such as an acryl resin, an epoxy resin, a phenolic resin, a polyamide resin, a polyimide resin, etc.

The touch sensing unit TSU may be disposed on the encapsulation layer TFEL. The touch sensing unit TSU includes a first touch insulating layer TINS1, connection electrodes CE, a second touch insulating layer TINS2, the driving electrodes TE, the sensing electrodes RE, and a third touch insulating layer TINS3.

The first touch insulating layer TINS1 may be formed of an inorganic layer, for example, a silicon nitride layer, a silicon oxynitride layer, a silicon oxide layer, a titanium oxide layer, or an aluminum oxide layer.

The connection electrodes CE may be disposed on the first touch insulating layer TINS1. The connection electrode CE may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The second touch insulating layer TINS2 is disposed on the first touch insulating layer TINS1 including the connection electrodes CE. The second touch insulating layer TINS2 may be formed of an inorganic layer, for example, a silicon nitride layer, a silicon oxynitride layer, a silicon oxide layer, a titanium oxide layer, or an aluminum oxide layer. Alternatively, the second touch insulating layer TINS2 may be formed of an organic layer such as an acryl resin, an epoxy resin, a phenolic resin, a polyamide resin and a polyimide resin.

The driving electrodes TE and the sensing electrodes RE may be disposed on the second touch insulating layer TINS2. In addition to the driving electrodes TE and the sensing electrodes RE, the dummy patterns DE, the first touch driving lines TL1, the second touch driving lines TL2 and the touch sensing lines RL shown in FIG. 4 may be disposed on the second touch insulating layer TINS1.

The driving electrodes TE, the sensing electrodes RE and the dummy electrodes DE may be implemented as conductive metal electrodes, and may be made of one of molybdenum (Mo), aluminum (Al), chromium (Cr), gold (Au), titanium (Ti), nickel (Ni), neodymium (Nd) and copper (Cu) or an alloy thereof. The driving electrodes TE, the sensing electrodes RE and the dummy electrodes DE are formed in a mesh structure or a net structure so that they do not overlap with the emission areas EA1 to EA4. Each of the driving electrodes TE and the sensing electrodes RE may overlap with some of the connection electrodes CE in the third direction (z-axis direction). The driving electrodes TE may be connected to the connection electrodes CE through touch contact holes TCNT1 penetrating through the second touch insulating layer TINS2.

The light-blocking members are applied onto some regions of the front surfaces of the driving electrodes TE and the sensing electrodes RE, and the applied light-blocking members are patterned in a predetermined plane code shape so that the code patterns CP are formed and disposed on some regions of the front surfaces of the driving electrodes TE and the sensing electrodes RE. In the process of patterning the code patterns CP, the light-blocking dummy patterns DPd may be formed together the code patterns CP.

The light-blocking member forming the code patterns CP and the light-blocking dummy patterns DPd may be formed of a material including an infrared or ultraviolet absorbing material. For example, the light-blocking members may be made of a material including an inorganic or organic black pigment. Herein, the inorganic black pigment may be a pigment containing at least one compound of carbon black, cyanine, polymethine, anthraquinone, and phthalocyanine-based compounds. On the other hand, the organic black pigment may include, but is not limited to, at least one of lactam black, perylene black, and aniline black.

The third touch insulating layer TINS3 is formed on the driving electrodes TE and the sensing electrodes RE including the code patterns CP and the light-blocking dummy patterns DPd. The third touch insulating layer TINS3 may provide a flat surface over the driving electrodes TE, the sensing electrodes RE and the connection electrodes BE1 which have different heights. To this end, the third touch insulating layer TINS3 may be formed of an inorganic layer, i.e., a silicon nitride layer, a silicon oxynitride layer, a silicon oxide layer, a titanium oxide layer, or an aluminum oxide layer. Alternatively, the third touch insulating layer TINS3 may be formed of an organic layer such as an acryl resin, an epoxy resin, a phenolic resin, a polyamide resin and a polyimide resin.

A plurality of color filter layers CFL1 and CFL3 may be formed on the touch sensing unit TSU. For example, a plurality of color filter layers CFL1 and CFL3 may be disposed on the third touch insulating layer TINS3 in the form of a plane.

Each of the color filter layers may be formed on the third touch insulating layer TINS3 so that they overlap the first to fourth emission areas EA1 to EA4, or may be formed on the second touch insulating layer TINS2 including the driving electrodes TE and the sensing electrodes RE so that they overlap with the first to fourth emission areas EA1 to EA4. The first color filter CFL1 may be disposed on the first emission area EA1 emitting light of the first color, the second color filter (not shown) may be disposed on the second emission area EA2 emitting light of the second color, and the third color filter CFL3 may be disposed on the third emission area EA3 emitting light of the third color. In addition, the second color filter (not shown) may be disposed also on the fourth emission area EA4 that emits light of the second color.

Figure 10:
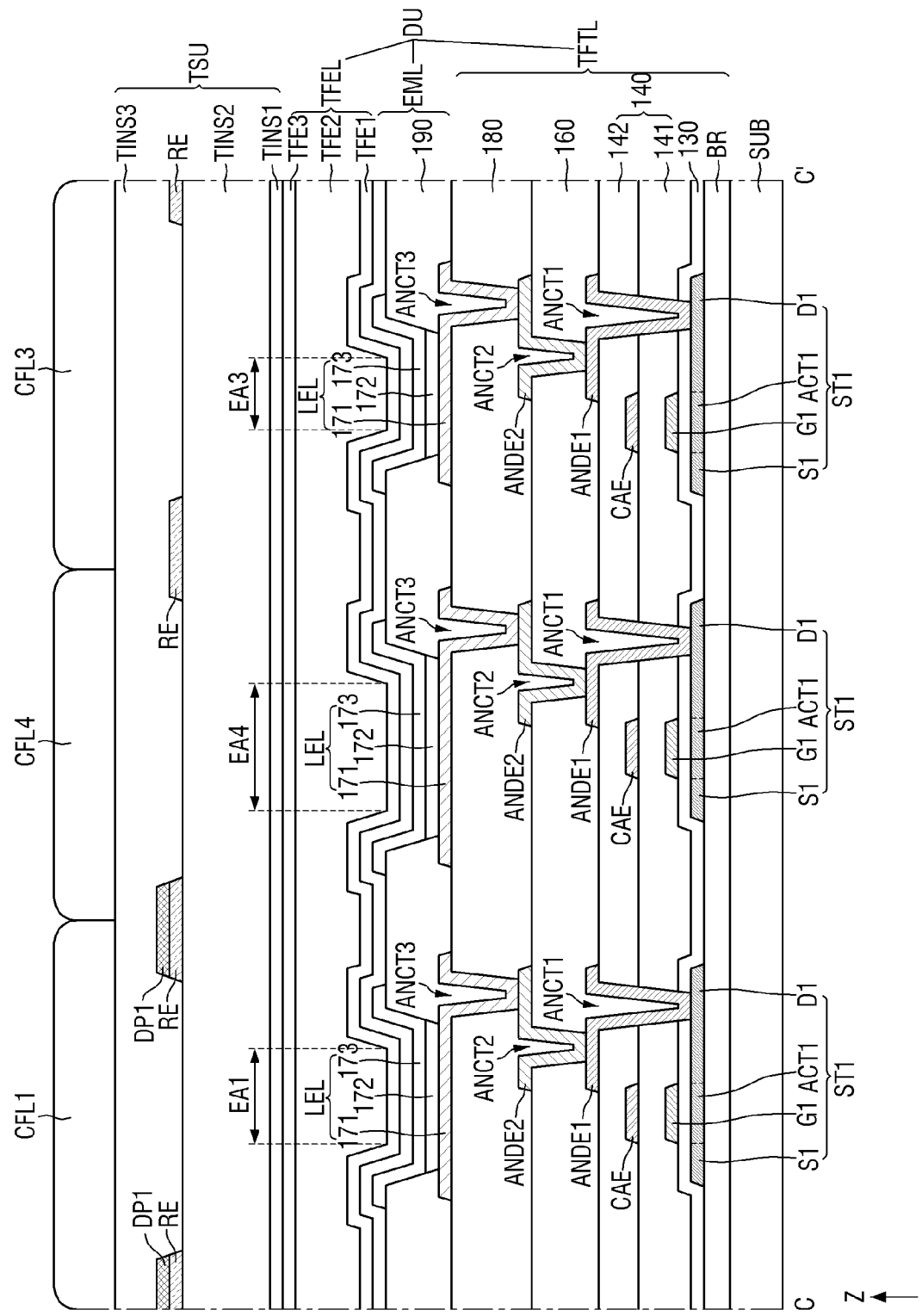
FIG. 10 is a cross-sectional view showing the cross-sectional structure, taken along line C-C' of FIGS. 7 and 8.

FIG. 10 is a cross-sectional view showing the cross-sectional structure, taken along line C-C' of FIGS. 7 and 8.

Referring to FIG. 10, the driving electrodes TE and the sensing electrodes RE are formed and disposed on the second touch insulating layer TINS2. Accordingly, a plurality of light-blocking members forming the code patterns CP and the light-blocking dummy patterns DPd may be formed on some regions of the front surfaces of the dummy electrodes DE.

The light-blocking members forming the code patterns CP are patterned in a predetermined plane code shape, and the light-blocking members forming the light-blocking dummy patterns DPd are patterned in a shape of a predetermined straight line or curved line different from the shape the code patterns CP.

Figure 11:
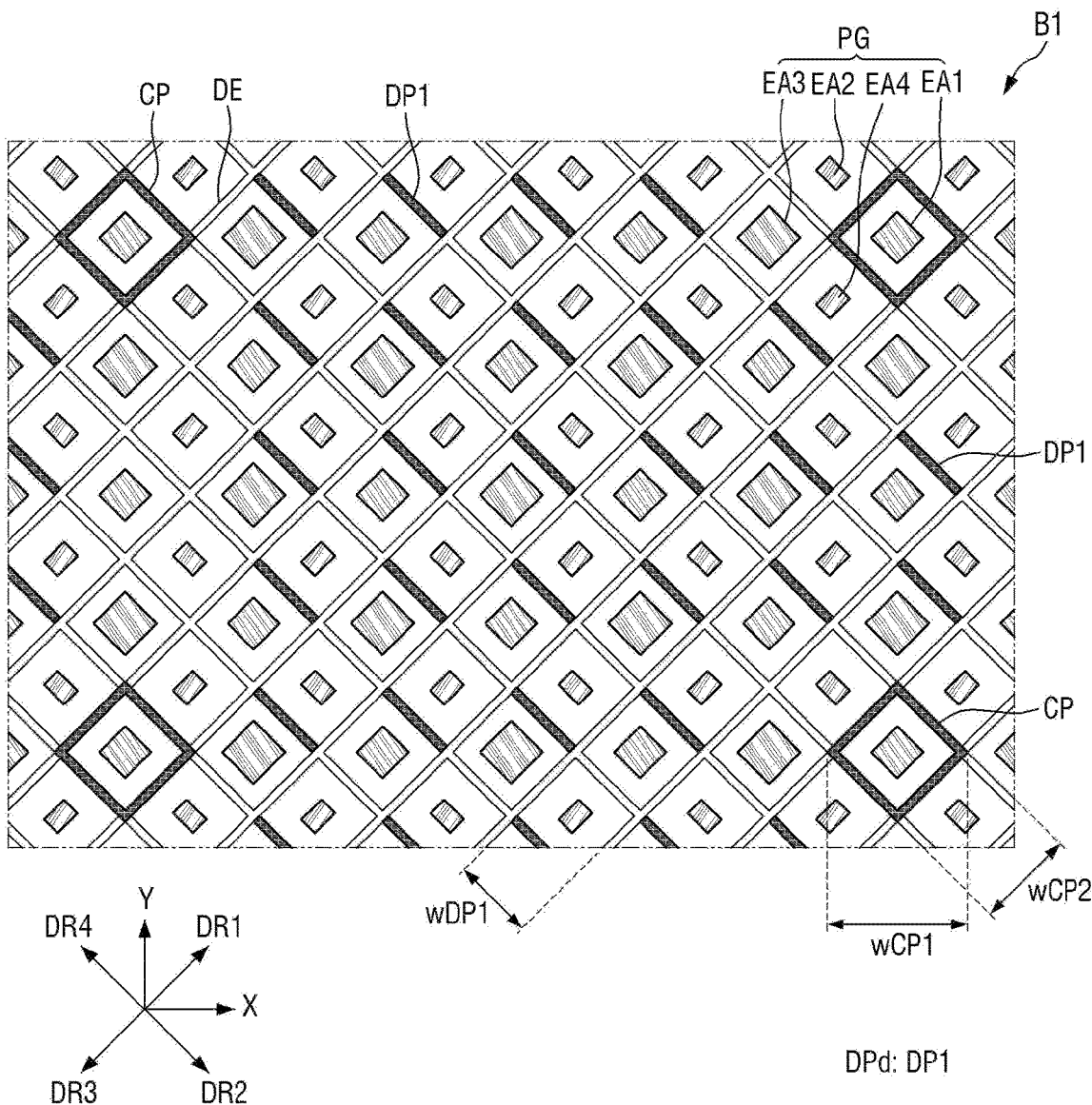
FIG. 11 is an enlarged view showing the arrangement structure of the code patterns and the sixth light-blocking patterns in area B1 shown in FIG. 6.

FIG. 11 is an enlarged view showing an arrangement structure of the code patterns and the first light-blocking patterns in area B1 shown in FIG. 6.

Referring to FIG. 11, code patterns CP may be formed at predetermined spacing of approximately 300 μm on the front surfaces of the dummy electrodes DE. In addition, the light-blocking dummy patterns DPd are formed on some other regions of the front surfaces of the dummy electrodes DE on which the code patterns CP are not formed such that they do not overlap with the code patterns CP.

The width wCP1 in at least one direction, the size and the length wCP2 in at least one direction of the code patterns CP may be set and formed so that they correspond to the size, sensing area, arrangement and the like of the light-receiving portion 21(b) or the optical image sensor included in the code detector 21 of the touch input device 20. Accordingly, the code detector 21 of the touch input device 20 may sense only the code shape of the code patterns CP formed with the predetermined width wCP1, size and length wCP2. On the other hand, the light-blocking dummy patterns DPd are formed in a straight line shape having a length different from the width wCP1 in at least one direction and the length wCP2 in at least one direction of the code patterns CP, so that they are not recognized by the code detector 21.

The light-blocking dummy patterns DPd may include a plurality of first dummy patterns DP1 extended in a straight line in the second and fourth directions DR2 and DR4 that are the first diagonal directions and arranged in parallel to the second diagonal directions perpendicular to the first diagonal directions. The first dummy patterns DP1 may be formed in a straight shape having a length different from the width wCP1 in at least one direction and the length wCP2 in at least one direction of the code patterns CP.

More specifically, widths of the first dummy patterns DP1 may be arranged in the first and third directions DR1 and DR3 that are the second diagonal directions of at least one of the first to fourth emission areas EA1 to EA4, and may be formed such that the length of the straight line is extended in second and fourth directions DR2 and DR4 that are the first diagonal directions perpendicular to the second diagonal directions. Accordingly, each of the first dummy patterns DP1 can block light scattering in the first and third directions DR1 and DR3 of at least one of the first to fourth emission areas EA1 to EA4.

The length of the straight line of the first dummy patterns DP1 may be larger than or shorter than the overall width wCP1 in at least one direction and the length wCP2 in at least one direction of the code patterns CP. The first dummy patterns DP1 may be arranged such that they maintain a constant distance from other adjacent first dummy patterns DP1 in the first and third directions DR1 and DR3. In addition, the first dummy patterns DP1 may be arranged such that they maintain a constant distance in the second and fourth directions DR2 and DR4, which are different from the distance in the first and third directions DR1 and DR3.

The distances in the first and third directions DR1 and DR3 and in the second and fourth directions DR2 and DR4 of the adjacent first dummy patterns DP1 may be set and formed differently depending on the sizes and the areas of the first to fourth emission areas EA1 to EA4.

On the other hand, when the first to fourth emission areas EA1 to EA4 are arranged in a vertical or horizontal stripe shape, the first dummy patterns DP1 may be arranged such that the length of the straight line is extended in the x-direction, i.e., the left-and-right (or horizontal) direction and they are arranged in parallel in the y-direction, i.e., the up-and-down (or vertical) direction.

Figure 12:
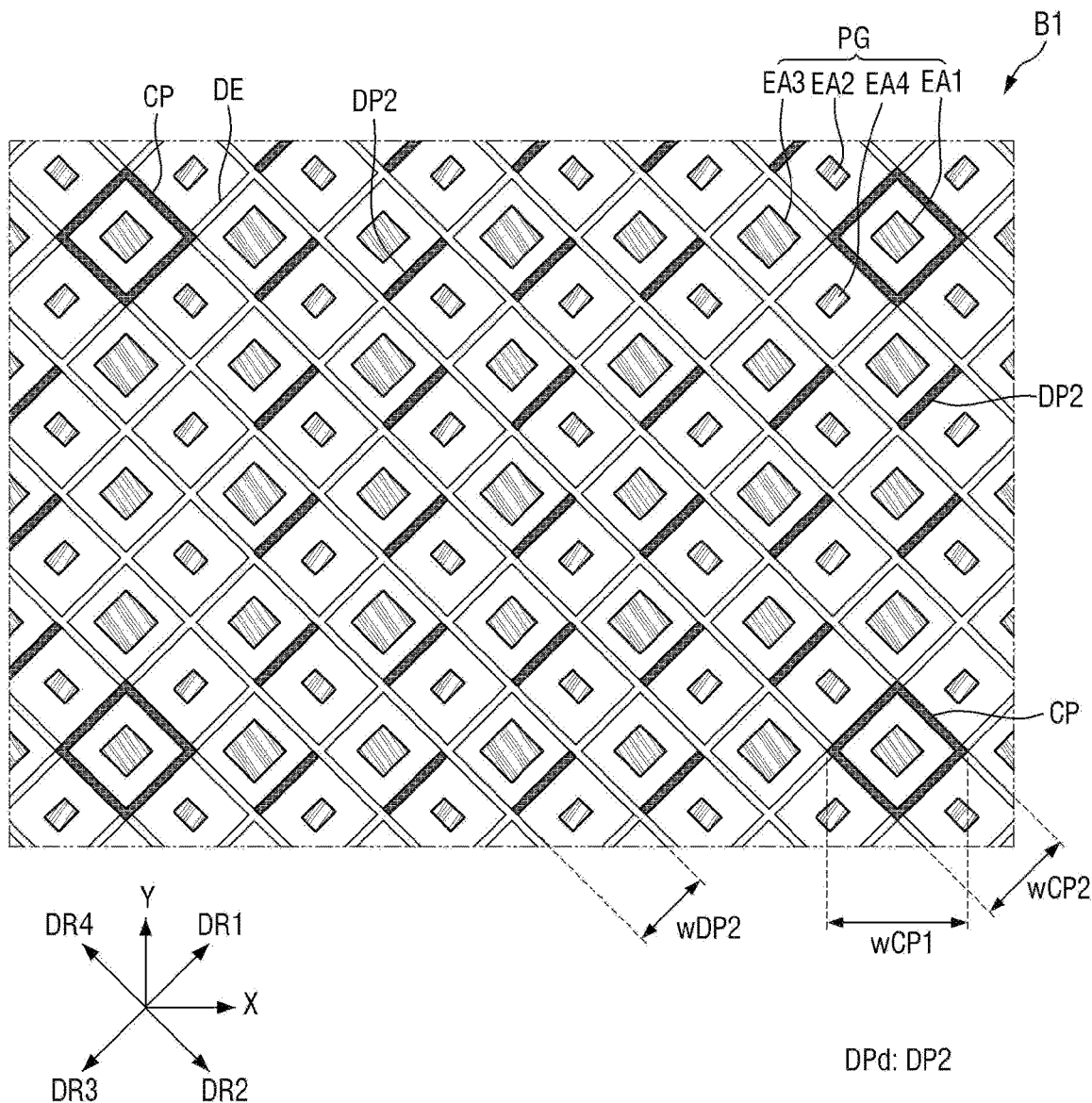
FIG. 12 is an enlarged view showing the arrangement structure of the code patterns and the second light-blocking patterns in area B1 shown in FIG. 6.

FIG. 12 is an enlarged view showing an arrangement structure of the code patterns and the second light-blocking patterns in area B1 shown in FIG. 6.

Referring to FIG. 12, code patterns CP may be formed at predetermined spacing on the front surfaces of the dummy electrodes DE. In addition, the light-blocking dummy patterns DPd are formed either regularly or irregularly on the other regions of the front surfaces of the dummy electrodes DE The code patterns CP are formed with the predetermined width wCP1, size and length wCP2 so that they can be sensed in a code shape by the code detector 21 of the touch input device 20. On the other hand, the light-blocking dummy patterns DPd may be formed in a straight line shape having a length different from the width wCP1, the size and the length wCP2 of the code patterns CP, so that they are not recognized as the code shape by the code detector 21.

Specifically, the light-blocking dummy patterns DPd may include a plurality of second dummy patterns DP2 extended in a straight line in the first and third directions DR1 and DR3 that are the second diagonal directions and arranged in parallel to the first diagonal directions perpendicular to the second diagonal directions. The second dummy patterns DP2 may be formed in a straight shape having a length different from the width wCP1 in at least one direction and the length wCP2 in at least one direction of the code patterns CP.

More specifically, widths of the second dummy patterns DP2 may be arranged in the second and fourth directions DR2 and DR4 that are the first diagonal directions of at least one of the first to fourth emission areas EA1 to EA4, and may be formed such that the length of the straight line is extended in first and third directions DR1 and DR3 that are the second diagonal directions perpendicular to the second diagonal directions. Accordingly, each of the second dummy patterns DP2 can block light scattering in the second and fourth directions DR2 and DR4 of at least one of the first to fourth emission areas EA1 to EA4.

The length of the straight line of the second dummy patterns DP2 may be larger than or shorter than the overall width wCP1 in at least one direction and the length wCP2 in at least one direction of the code patterns CP. The second dummy patterns DP2 may be arranged such that they maintain a constant distance from other adjacent second dummy patterns DP2 in the second and fourth directions DR2 and DR4 that are the first diagonal directions perpendicular thereto. In addition, the second dummy patterns DP2 may be arranged such that they maintain a constant distance in the first and third directions DR1 and DR3, which are different from the distance in the first diagonal directions.

The distances in the second and fourth directions DR2 and DR4 and in the first and third directions DR1 and DR3 of the adjacent second dummy patterns DP2 may be set and formed differently depending on the sizes and the areas of the first to fourth emission areas EA1 to EA4.

As described above, when the first to fourth emission areas EA1 to EA4 are arranged in a vertical or horizontal stripe shape, the second dummy patterns DP2 may be arranged such that the length of the straight line is extended in the y-direction, i.e., the vertical direction (or up-and-down direction) and they are arranged in parallel in the x-direction, i.e., the horizontal direction (or left-and-right direction).

Figure 13:
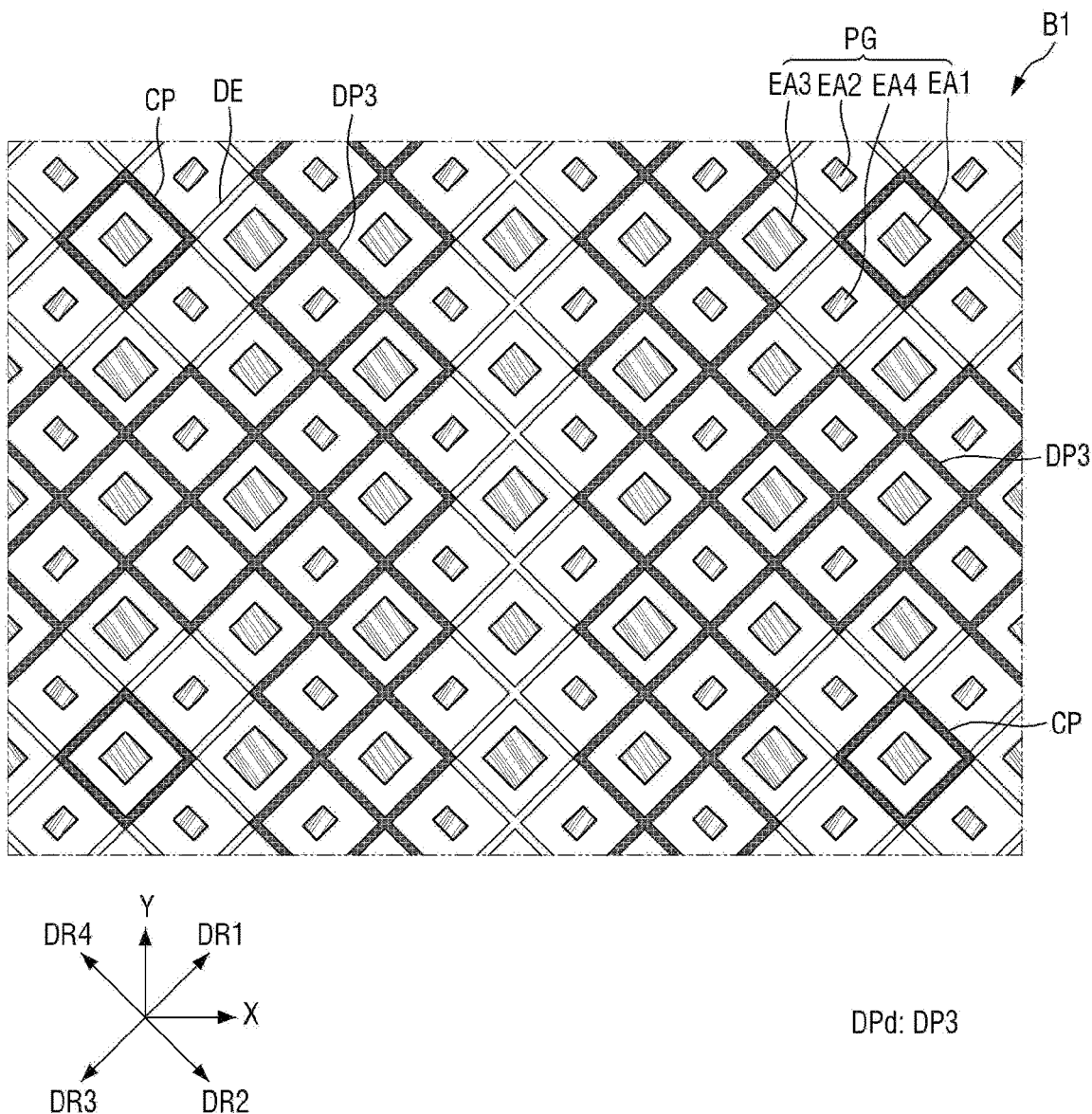
FIG. 13 is an enlarged view showing the arrangement structure of the code patterns and the sixth light-blocking patterns in area B1 shown in FIG. 6.

FIG. 13 is an enlarged view showing an arrangement structure of the code patterns and the third light-blocking patterns in area B1 shown in FIG. 6.

Referring to FIG. 13, code patterns CP are formed at predetermined spacing on the dummy electrodes DE. The light-blocking dummy patterns DPd may be formed in a mesh structure having a predetermined size on each of the dummy electrodes DE in the other region than the regions where the code patterns CP are formed.

In other words, the light-blocking dummy patterns DPd may include third dummy patterns DP3 that surround some of the plurality of emission areas and have the overall shape in a mesh structure when viewed from the top. Specifically, when the third dummy patterns DP3 surround the emission areas instead of a single emission area, the overall shape of each of the third dummy patterns DP3 may be formed in a mesh structure when viewed from the top.

Since the overall width and length of the light-blocking dummy patterns DPd of the mesh structure, i.e., the third dummy patterns DP3 are greater or longer than the widths wCP1 and the length wCP2 of the code patterns CP, they are not recognized as a code shape by the code detector 21.

The size and overall shape of each of the third dummy patterns DP3 when viewed from the top may be formed differently depending on the sizes and areas of the first to fourth emission areas EA1 to EA4. In addition, the size and overall shape of each of the third dummy patterns DP3 when viewed from the top may be formed differently depending on the spacing between the code patterns CP. Accordingly, the size and overall shape of each of the third dummy patterns DP3 when viewed from the top may be different from those of the third dummy patterns DP3 adjacent to each other.

Alternatively, the third dummy patterns DP3 may have the same size and overall shape when viewed from the top depending on the sizes and areas of the first to fourth emission areas EA1 to EA4 or the spacing between the code patterns CP. In this instance, the adjacent third dummy patterns DP3 may have the same size and overall shape when viewed from the top.

Figure 14:
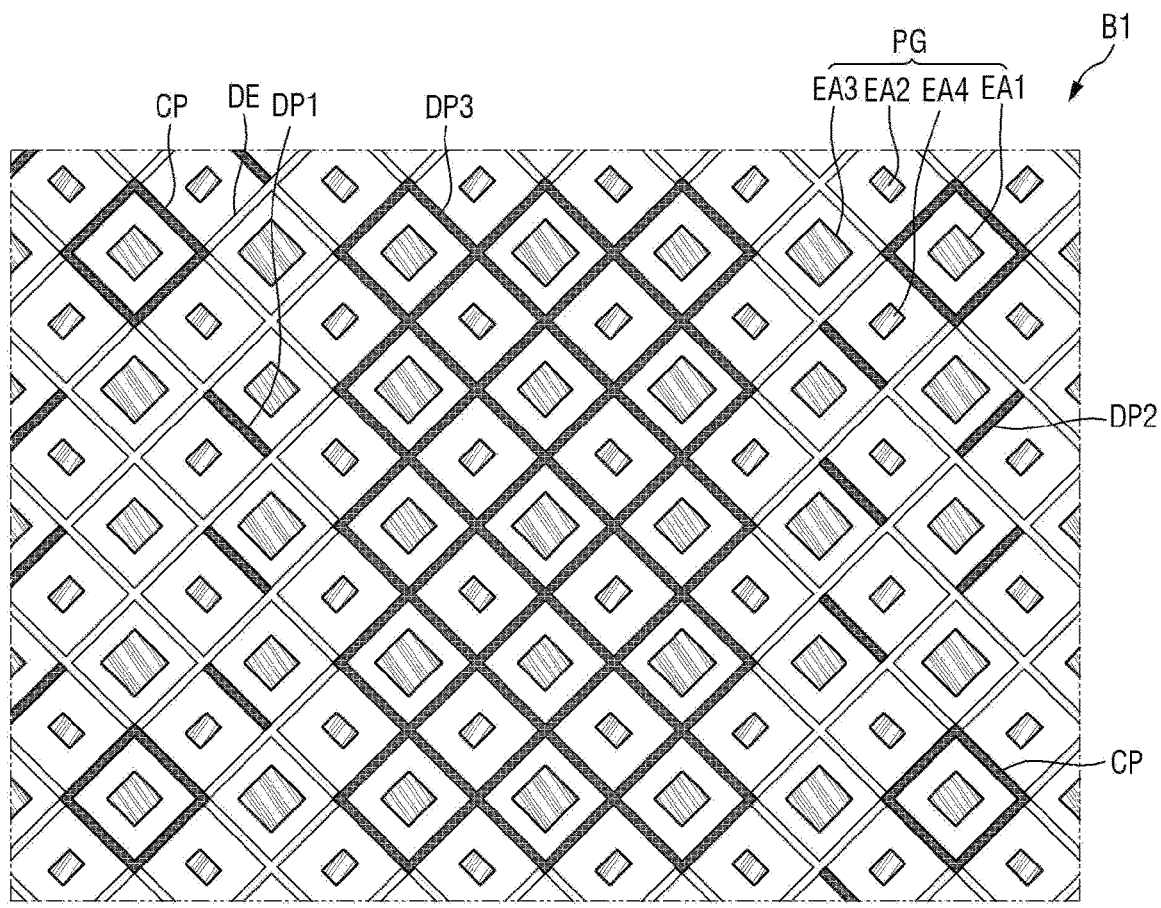
FIG. 14 is an enlarged view showing the arrangement structure of the first to third light-blocking patterns in area B1 shown in FIG. 6.
Figure 14:
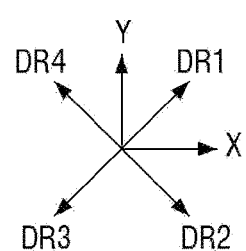

FIG. 14 is an enlarged view showing an arrangement structure of the first to third light-blocking patterns in area B1 shown in FIG. 6.

Referring to FIG. 14, light-blocking dummy pattern DPd may be formed irregularly on some regions of the front surfaces of the dummy electrodes DE other than the regions where the code patterns CP are formed.

Specifically, the light-blocking dummy patterns DPd may include first dummy patterns DP1 arranged in parallel in the second diagonal directions such that the length of a straight line is extended in the second and fourth directions DR2 and DR4 that are the first diagonal directions of each pixel area, and second dummy patterns DP2 arranged in parallel in the first diagonal direction such that the length of a straight line is extended in the first and third directions DR1 and DR4 that are the second diagonal directions. In addition, the light-blocking dummy patterns DPd may further include third dummy patterns DP3 that surround some of the plurality of emission areas EA1 to EA4 together with the first and second dummy patterns DP1 and DP2 so that the overall shape has a mesh structure when viewed from the top.

The first to third dummy patterns DP1, DP2 and DA3 may be arranged one after another repeatedly in the x-direction that is the horizontal direction, while the dummy patterns of the same shape may be arranged in the y-direction that is the vertical direction when viewed from the top.

Figure 15:
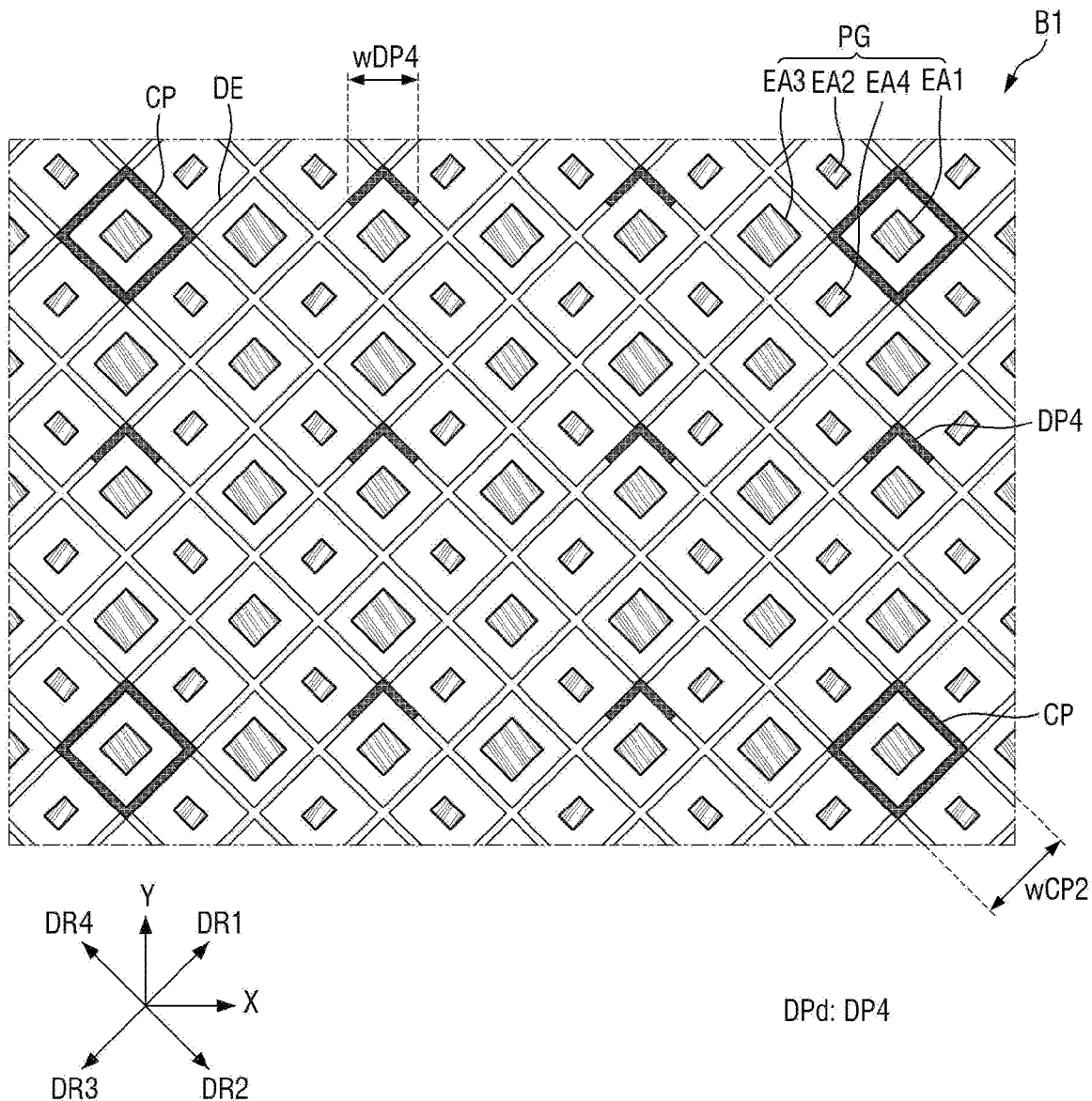
FIG. 15 is an enlarged view showing the arrangement structure of the code patterns and the fourth light-blocking patterns in area B1 shown in FIG. 6.

FIG. 15 is an enlarged view showing an arrangement structure of the code patterns and the fourth light-blocking patterns in area B1 shown in FIG. 6.

Referring to FIG. 15, light-blocking dummy pattern DPd may be formed irregularly on some regions of the front surfaces of the dummy electrodes DE other than the regions where the code patterns CP are formed. The light-blocking dummy patterns DPd may be formed in a shape and a size different from those of the code patterns CP, so that they are not recognized as a code shape by the code detector 21.

The light-blocking dummy patterns DPd may include fourth dummy patterns DP4 that are disposed and formed in a shape surrounding in the horizontal direction (or left-and-right direction) of at least one emission area among the first to fourth emission areas EA1 to EA4, i.e., in the x-direction or in the vertical direction (or upper-and-down direction), i.e., in the y-direction.

For example, the fourth dummy patterns DP4 may be disposed and formed in a shape surrounding in the y-direction, which is the vertical (or upper-and-down direction) of the first emission area EA1 among the first to fourth emission areas EA1 to EA4. Accordingly, the fourth dummy patterns DP4 can block light emitted from the first emission areas EA1 and scattering in the vertical y direction, i.e., the y-direction.

In the stack structure forming the first to fourth emission areas EA1 to EA4, a line may be further formed in at least one pixel column or pixel row direction among the first to fourth emission areas EA1 to EA4. For example, when a line is further formed in the pixel row direction in which the first and third emission areas EA1 and EA3 are arranged, the first and third emission areas EA1 and EA3 may be inclined at a predetermined slope. Accordingly, by disposing the fourth dummy patterns DP4 in the inclination direction or opposite to the inclination direction of the inclined first and third emission areas EA1 and EA3, it is possible to block light that scatters in the inclination direction of the first and third emission areas EA1 and EA3 or the opposite direction.

Although the fourth dummy patterns DP4 are formed to surround in the y-direction of the first emission areas EA1 in the example shown in FIG. 15, the fourth dummy patterns DP4 may be formed in a shape surrounding in the y-direction of the first and third emission areas EA1 and EA3. Alternatively, the dummy patterns DP4 may be formed to surround in the y-direction of the second and fourth emission areas EA2 and EA4. The fourth dummy patterns DP4 may be bent or curved at least once, and the length wDP4 of each of the fourth dummy patterns DP4 may be larger than or smaller than the width wCP1 and the length wCP2 of the code patterns CP.

Figure 16:
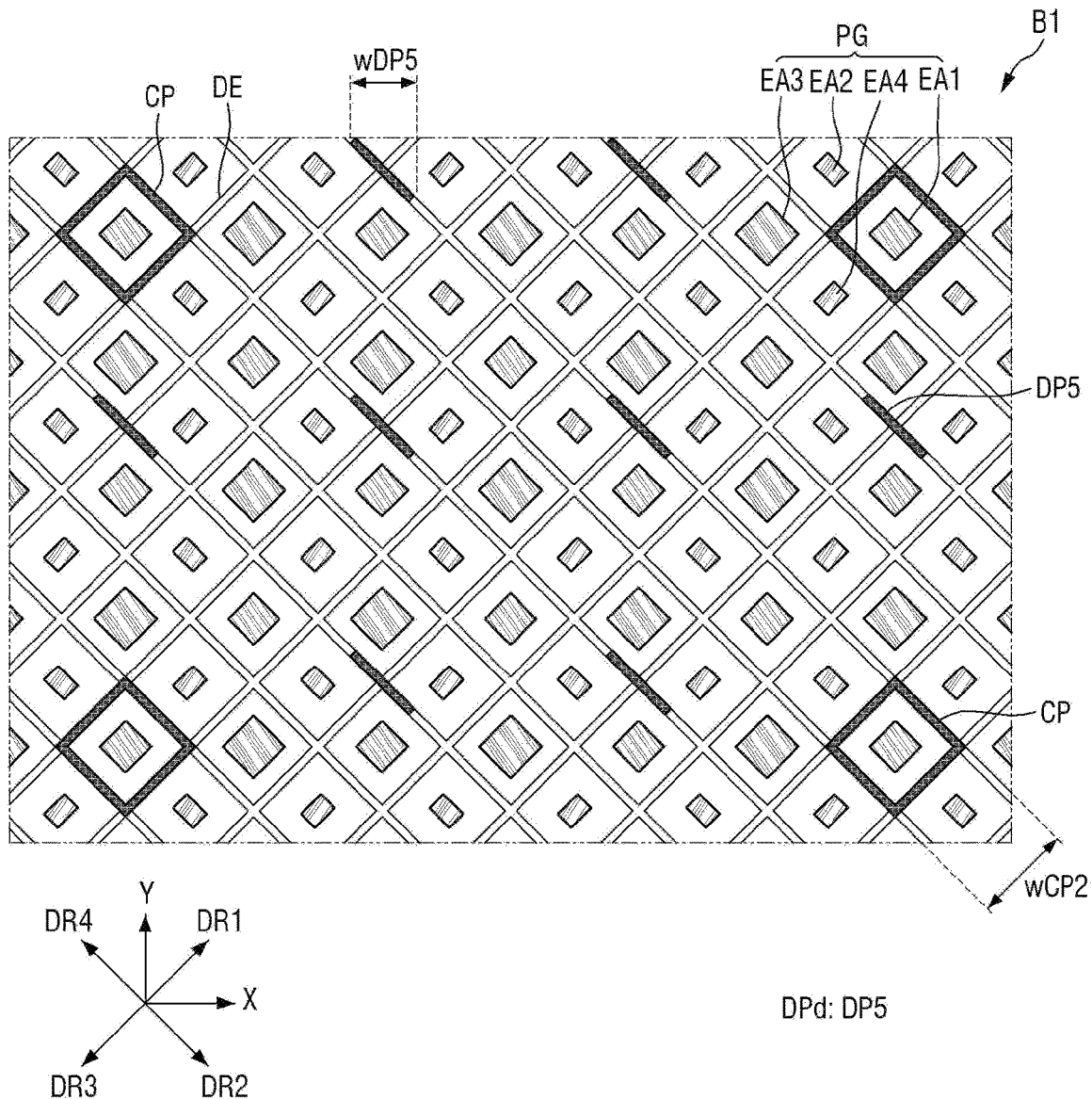
FIG. 16 is an enlarged view showing the arrangement structure of the code patterns and the sixth light-blocking patterns in area B1 shown in FIG. 6.

FIG. 16 is an enlarged view showing an arrangement structure of the code patterns and the fifth light-blocking patterns in area B1 shown in FIG. 6.

Referring to FIG. 16, light-blocking dummy pattern DPd may be formed irregularly on some regions of the front surfaces of the dummy electrodes DE other than the regions where the code patterns CP are formed. The light-blocking dummy patterns DPd may be formed in a shape and a size different from those of the code patterns CP, so that they are not recognized as a code shape by the code detector 21.

The light-blocking dummy patterns DPd may include fifth dummy patterns DP5 that are disposed in the first and third directions DR1 and DR3 which are the second diagonal directions of at least two of the first to fourth emission areas EA1 to EA4, and are formed such that the length of the straight line is extended in second and fourth directions DR2 and DR4 which are the first diagonal directions perpendicular to the first and third directions DR1 and DR3.

Each of the fifth dummy patterns DP5 can block light scattering in the first and third directions DR1 and DR3 of at least two of the first to fourth emission areas EA1 to EA4. The length wDP5 of each of the fifth dummy patterns DP5 may be different from the width wCP1 and length wCP2 of the code patterns CP, and may be larger than or smaller than them.

Although not shown in the drawings, each of the fifth dummy patterns DP5 may be disposed in the second and fourth directions DR2 and DR4 which are the first diagonal directions of at least two of the first to fourth emission areas EA1 to EA4. In addition, the length of the straight line may be extended in the second diagonal directions perpendicular to the first diagonal directions, i.e., in the first and third directions DR1 and DR3. Each of the fifth dummy patterns DP5 can block light scattering in the second and fourth directions DR2 and DR4 of at least two of the first to fourth emission areas EA1 to EA4.

Each of the fifth dummy patterns DP5 may be disposed and formed in the horizontal direction (or left-and-right direction) of at least two emission areas among the first to fourth emission areas EA1 to EA4, i.e., in the x-direction or in the vertical direction (or upper-and-down direction), i.e., in the y-direction. For example, each of the fifth dummy patterns DP5 may be formed in the x-direction of at least two of the first to fourth emission areas EA1 to EA4, and may the length of the straight line may be extended in the y-direction. In this instance, the fifth dummy patterns DP5 can block light emitted from at least two emission areas and scattering in the y-direction. On the other hand, each of the fifth dummy patterns DP5 may be formed in the y-direction of at least two of the first to fourth emission areas EA1 to EA4, and may the length of the straight line may be extended in the x-direction. In this instance, the fifth dummy patterns DP5 can block light emitted from at least two emission areas and scattering in the x-direction.

Figure 17:
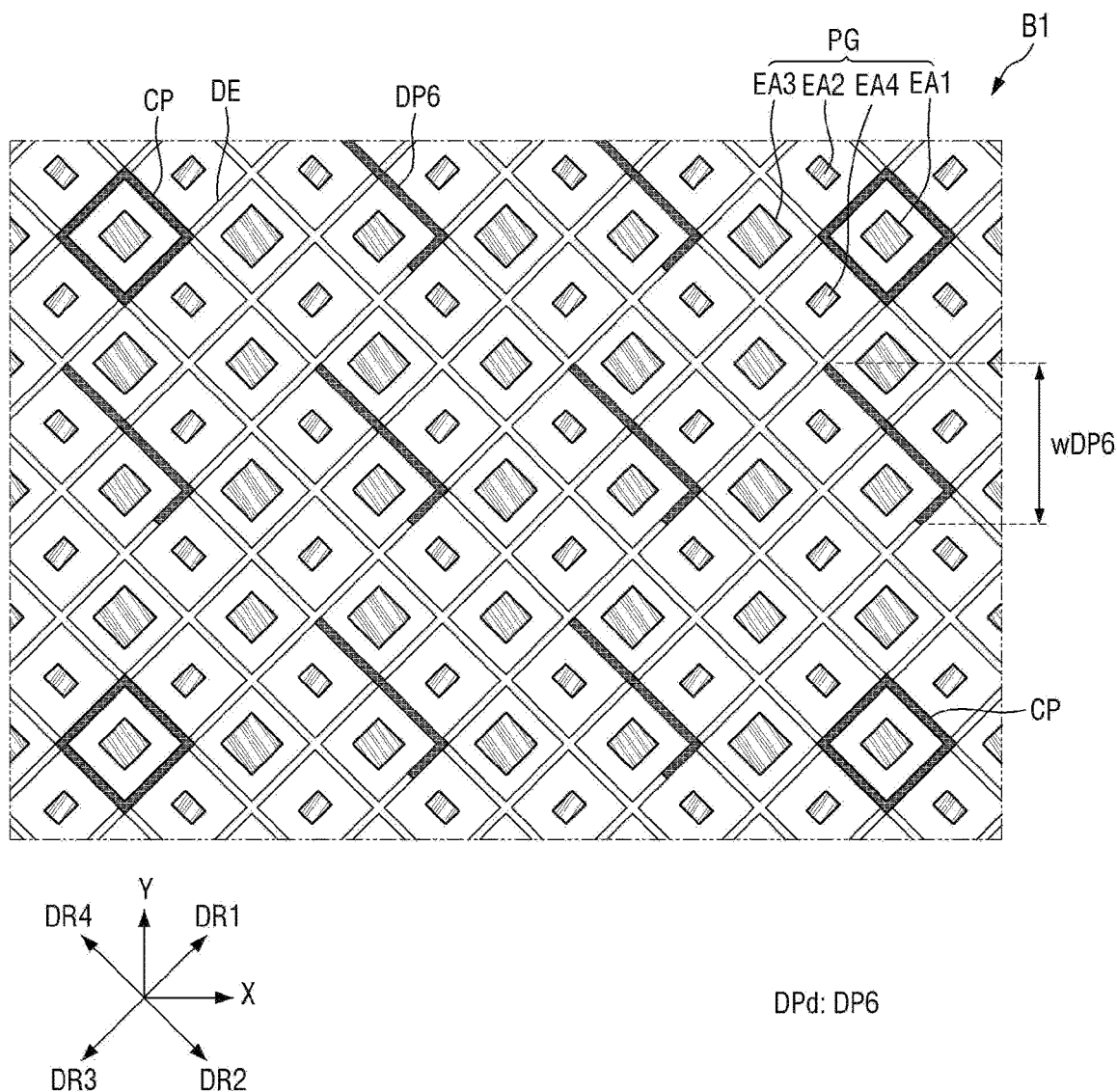
FIG. 17 is an enlarged view showing the arrangement structure of the code patterns and the sixth light-blocking patterns in area B1 shown in FIG. 6.

FIG. 17 is an enlarged view showing an arrangement structure of the code patterns and the sixth light-blocking patterns in area B1 shown in FIG. 6.

Referring to FIG. 17, the light-blocking dummy patterns DPd may be formed in a shape and a size different from those of the code patterns CP, so that they are not recognized as a code shape by the code detector 21.

The light-blocking dummy patterns DPd may include sixth dummy patterns DP6 that are disposed in a shape surrounding in the second diagonal directions and the horizontal direction (or left-and-right direction) of at least one emission area among the first to fourth emission areas EA1 to EA4, i.e., in the x-direction, and the length of the straight line is extended in the first diagonal directions.

Each of the sixth dummy patterns DP6 can block light scattering in the first and third directions DR1 and DR3 and the x-direction of at least two of the first to fourth emission areas EA1 to EA4. The length wDP6 of each of the sixth dummy patterns DP6 may be larger than or smaller than the width wCP1 and length wCP2 of the code patterns CP.

Although not shown in the drawings, each of the sixth dummy patterns DP6 may be disposed in a shape surrounding in the first diagonal directions and the vertical direction (or up-and-down direction) of at least two of the first to fourth emission areas EA1 to EA4, and the length of the straight line may be extended in the second diagonal directions. Each of the sixth dummy patterns DP6 can block light scattering in the second and fourth directions DR2 and DR4 and the y-direction of at least two of the first to fourth emission areas EA1 to EA4.

Figure 18:
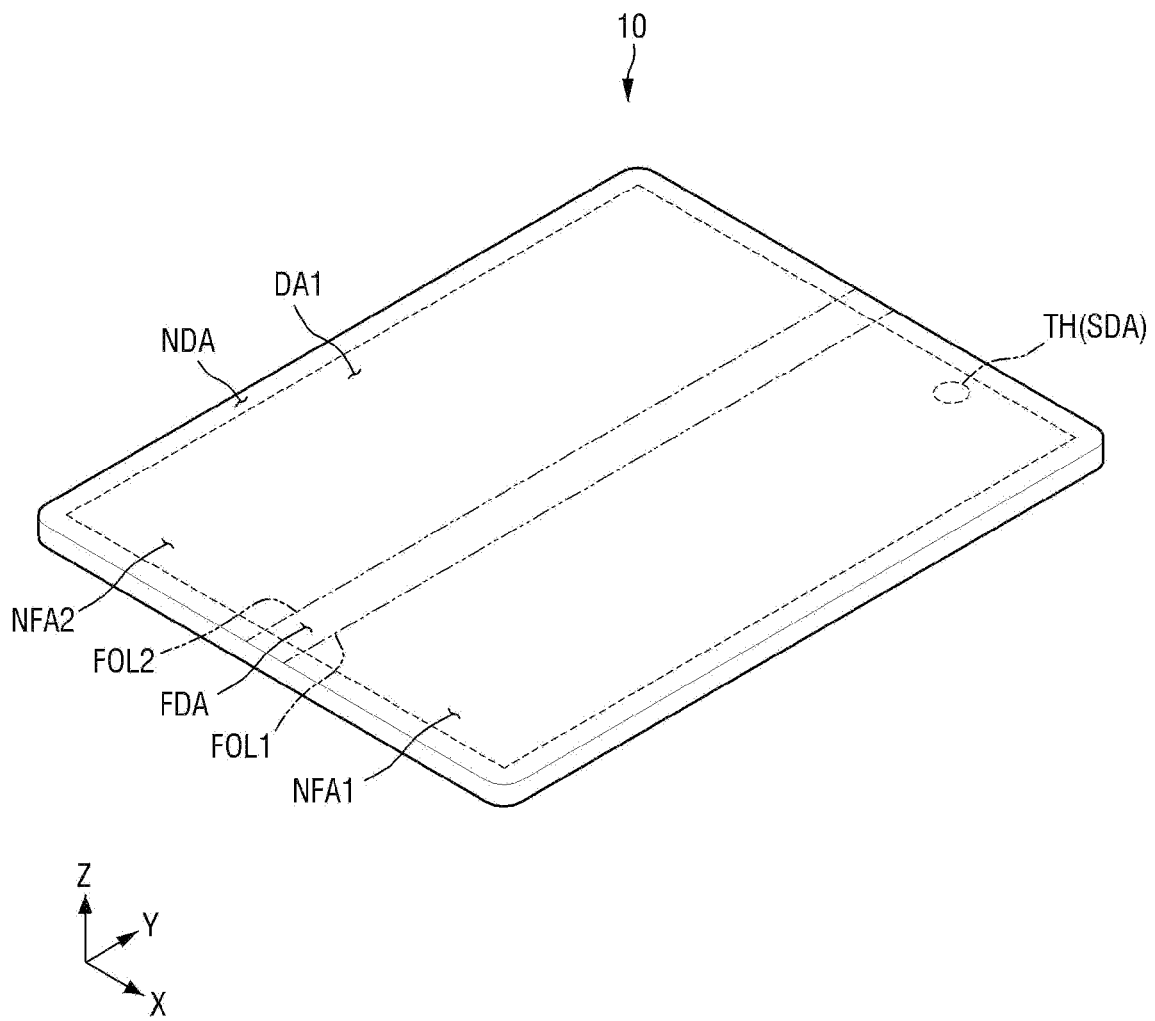
FIGS. 18 and 19 are perspective views showing a display device according to another embodiment.
Figure 19:
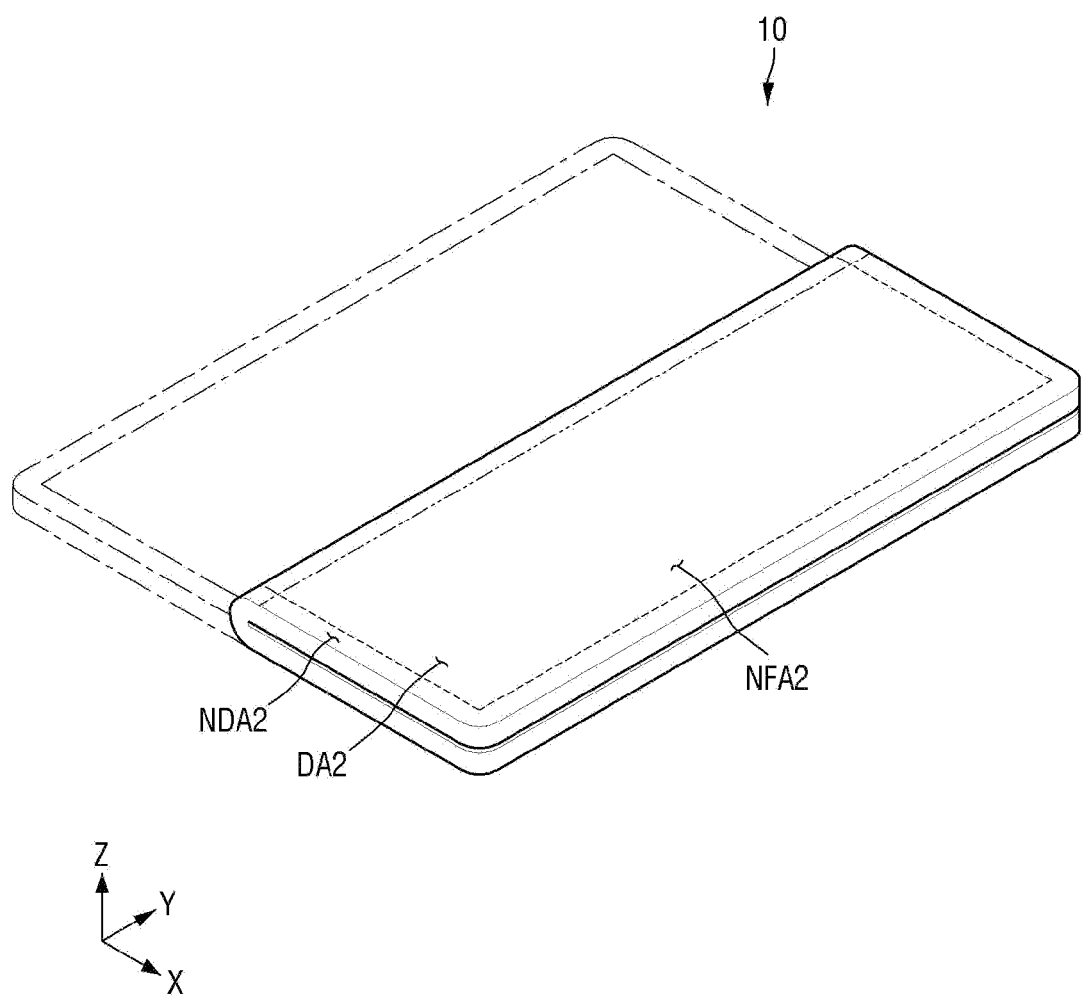

FIGS. 18 and 19 are perspective views showing a display device according to another embodiment.

In the example shown in FIGS. 18 and 19, a display device 10 is a foldable display device that is folded in the first direction (x-axis direction). The display device 10 may remain folded as well as unfolded. The display device 10 may be folded inward (in-folding manner) such that the front surface is located inside. When the display device 10 is bent or folded in the in-folding manner, a part of the front surface of the display device 10 may face the other part of the front surface. Alternatively, the display device 10 may be folded outward (out-folding manner) such that the front surface is located outside. When the display device 10 is bent or folded in the out-folding manner, a part of the rear surface of the display device 10 may face the other part of the rear surface.

The first non-folding area NFA1 may be disposed on one side, for example, the right side of the folding area FDA. The second non-folding area NFA2 may be disposed on the opposite side, for example, the left side of the folding area FDA. The touch sensing unit TSU according to the embodiment of the present disclosure may be formed and disposed on each of the first non-folding area NFA1 and the second non-folding area NFA2.

The first folding line FOL1 and the second folding line FOL2 may be extended in the second direction (y-axis direction), and the display device 10 may be folded in the first direction (x-axis direction). As a result, the length of the display device 10 in the first direction (the x-axis direction) may be reduced to about half, so that a user can carry the display device 10 easily.

The direction in which the first folding line FOL1 and the second folding line FOL2 are extended is not limited to the second direction (y-axis direction). For example, the first folding line FOL1 and the second folding line FOL2 may be extended in the first direction (x-axis direction), and the display device 10 may be folded in the second direction (y-axis direction). In such case, the length of the display device 10 in the second direction (y-axis direction) may be reduced to about half. Alternatively, the first folding line FOL1 and the second folding line FOL2 may be extended in a diagonal direction of the display device 10 between the first direction (x-axis direction) and the second direction (y-axis direction). In such case, the display device 10 may be folded in a triangle shape.

When the first folding line FOL1 and the second folding line FOL2 are extended in the second direction (y-axis direction), the length of the folding area FDA in the first direction (x-axis direction) may be smaller than the length in the second direction (y-axis direction). In addition, the length of the first non-folding area NFA1 in the first direction (x-axis direction) may be larger than the length of the folding area FDA in the first direction (x-axis direction). The length of the second non-folding area NFA2 in the first direction (x-axis direction) may be larger than the length of the folding area FDA in the first direction (x-axis direction).

The first display area DA1 may be disposed on the front side of the display device 10. The first display area DA1 may overlap the folding area FDA, the first non-folding area NFA1, and the second non-folding area NFA2. Therefore, when the display device 10 is unfolded, images may be displayed on the front side of the folding area FDA, the first non-folding area NFA1 and the second non-folding area NFA2 of the display device 10.

The second display area DA2 may be disposed on the rear side of the display device 10. The second display area DA2 may overlap the second non-folding area NFA2. Therefore, when the display device 10 is folded, images may be displayed on the front side of the second non-folding area NFA2 of the display device 10.

Although the through hole TH where a camera SDA or the like is formed is located in the first non-folding area NFA1 in FIGS. 18 and 19, the present disclosure is not limited thereto. The through hole TH or the camera SDA may be located in the second non-folding area NFA2 or the folding area FDA.

Figure 20:
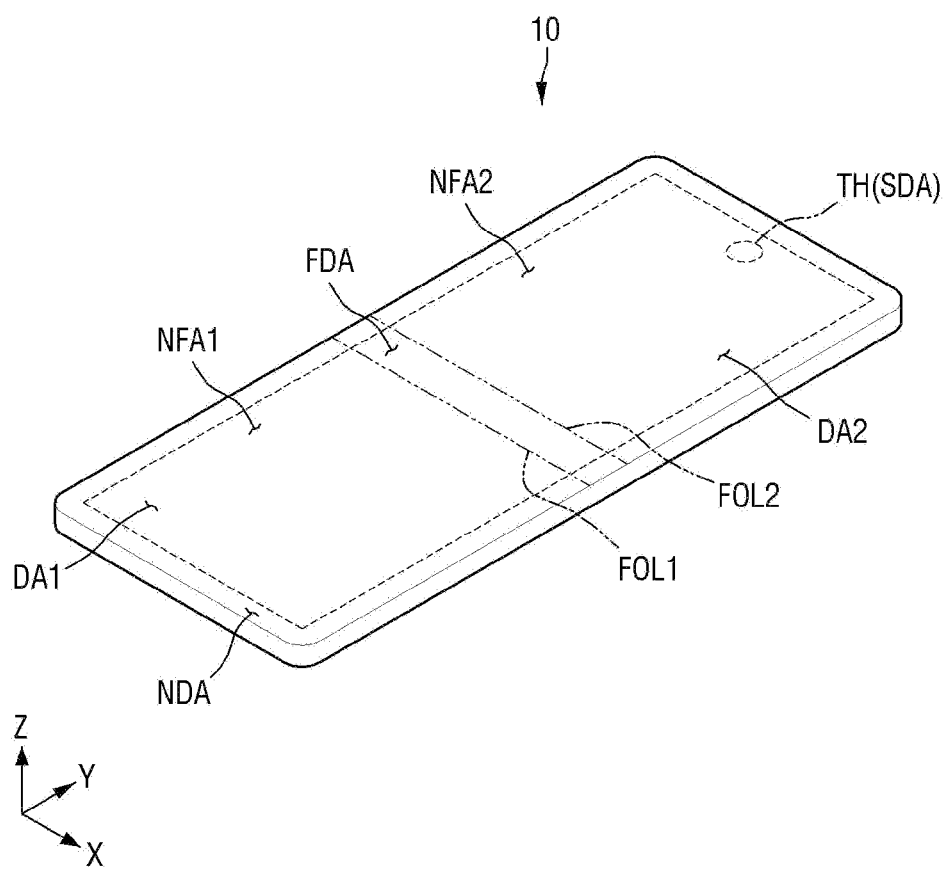
FIGS. 20 and 21 are perspective views showing a display device according to still another embodiment of the present disclosure.
Figure 21:
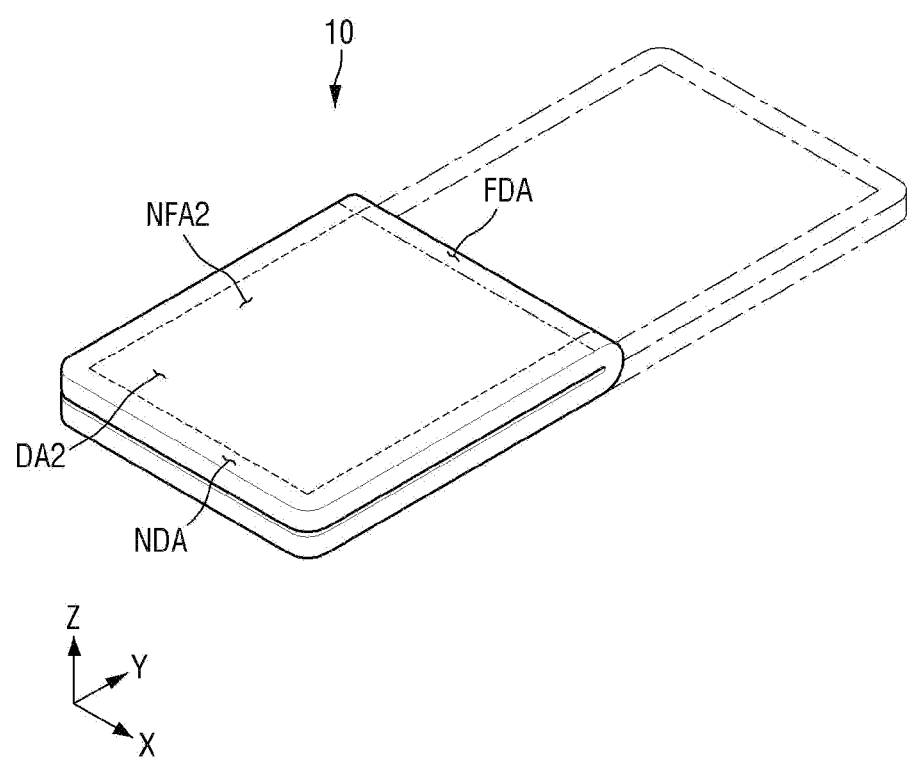

FIGS. 20 and 21 are perspective views showing a display device according to still another embodiment of the present disclosure.

In the example shown in FIGS. 20 and 21, a display device 10 is a foldable display device that is folded in the second direction (y-axis direction). The display device 10 may remain folded as well as unfolded. The display device 10 may be folded inward (in-folding manner) such that the front surface is located inside. When the display device 10 is bent or folded in the in-folding manner, a part of the front surface of the display device 10 may face the other part of the front surface. Alternatively, the display device 10 may be folded outward (out-folding manner) such that the front surface is located outside. When the display device 10 is bent or folded in the out-folding manner, a part of the rear surface of the display device 10 may face the other part of the rear surface.

The display device 10 may include a folding area FDA, a first non-folding area NFA1, and a second non-folding area NFA2. The display device 10 can be folded at the folding area FDA, while it cannot be folded at the first non-folding area NFA1 and the second non-folding area NFA2. The first non-folding area NFA1 may be disposed on one side, for example, the lower side of the folding area FDA. The second non-folding area NFA2 may be disposed on the other side, for example, the upper side of the folding area FDA.

The touch sensing unit TSU according to the embodiment of the present disclosure may be formed and disposed on each of the first non-folding area NFA1 and the second non-folding area NFA2.

The folding area FDA may be an area bent with a predetermined curvature over the first folding line FOL1 and the second folding line FOL2. Therefore, the first folding line FOL1 may be a boundary between the folding area FDA and the first non-folding area NFA1, and the second folding line FOL2 may be a boundary between the folding area FDA and the second non-folding area NFA2.

The first folding line FOL1 and the second folding line FOL2 may be extended in the first direction (x-axis direction) as shown in FIGS. 20 and 21, and the display device 10 may be folded in the second direction (y-axis direction). As a result, the length of the display device 10 in the second direction (the y-axis direction) may be reduced to about half, so that the display device 10 is easy to carry.

The direction in which the first folding line FOL1 and the second folding line FOL2 are extended is not limited to the first direction (x-axis direction). For example, the first folding line FOL1 and the second folding line FOL2 may be extended in the second direction (y-axis direction), and the display device 10 may be folded in the first direction (x-axis direction). In such case, the length of the display device 10 in the first direction (x-axis direction) may be reduced to about half. Alternatively, the first folding line FOL1 and the second folding line FOL2 may be extended in a diagonal direction of the display device 10 between the first direction (x-axis direction) and the second direction (y-axis direction). In such case, the display device 10 may be folded in a triangle shape.

When the first folding line FOL1 and the second folding line FOL2 are extended in the first direction (x-axis direction) as shown in FIGS. 20 and 21, the length of the folding area FDA in the second direction (y-axis direction) may be smaller than the length in the first direction (x-axis direction). In addition, the length of the first non-folding area NFA1 in the second direction (y-axis direction) may be larger than the length of the folding area FDA in the second direction (y-axis direction). The length of the second non-folding area NFA2 in the second direction (y-axis direction) may be larger than the length of the folding area FDA in the second direction (y-axis direction).

The first display area DA1 may be disposed on the front side of the display device 10. The first display area DA1 may overlap the folding area FDA, the first non-folding area NFA1, and the second non-folding area NFA2. Therefore, when the display device 10 is unfolded, images may be displayed on the front side of the folding area FDA, the first non-folding area NFA1 and the second non-folding area NFA2 of the display device 10.

The second display area DA2 may be disposed on the rear side of the display device 10. The second display area DA2 may overlap the second non-folding area NFA2. Therefore, when the display device 10 is folded, images may be displayed on the front side of the second non-folding area NFA2 of the display device 10.

Although the through hole TH where the camera SDA or the like is disposed is located in the second non-folding area NFA2 in FIGS. 20 and 21, the present disclosure is not limited thereto. The through hole TH may be located in the first non-folding area NFA1 or the folding area FDA.

While the present disclosure has been described with reference to embodiments thereof, it will be apparent to those of ordinary skill in the art that various changes and modifications may be made thereto without departing from the scope and spirit of the present disclosure as set forth in the following claims.

What is claimed is:

1. A display device comprising:
   a display unit comprising a plurality of emission areas;
   a plurality of touch electrodes disposed between the plurality of emission areas to sense a touch;
   a plurality of code patterns formed by covering a part of a front surface of at least one of the plurality of touch electrodes with a predetermined code shape; and
   a plurality of light-blocking patterns formed on at least one of the plurality of touch electrodes on which the plurality of code patterns is not formed, to block light,
   wherein the plurality of light-blocking patterns is formed by covering at least one of a front surface and side surfaces of the at least one touch electrode with a predetermined pattern shape,
   wherein the plurality of touch electrodes comprises a reflective material,
   wherein the plurality of touch electrodes do not include a black pigment, and
   wherein the plurality of code patterns comprises a light blocking material that includes the black pigment.

2. The display device of claim 1, wherein a shape of the plurality of code patterns when viewed from top is one of: a closed loop shape of at least one of a rectangle, a square, a circle and a diamond; an open loop shape partially surrounding at least one of the plurality of emission areas; and a straight line shape having a predetermined length.

3. The display device of claim 2, wherein the plurality of code patterns and the plurality of light-blocking patterns comprise an inorganic or organic black pigment absorbing infrared or ultraviolet light, and are formed by patterning to cover a part of at least one of a front surface and a side surface of at least one touch electrode among the plurality of touch electrodes such that they do not overlap each other.

4. The display device of claim 1, wherein the plurality of touch electrodes comprises a plurality of driving electrodes, a plurality of sensing electrodes and a plurality of dummy electrodes, and wherein the plurality of driving electrodes, the plurality of sensing electrodes and the plurality of dummy electrodes are formed in a mesh structure surrounding between and around the emission areas.

5. The display device of claim 4, wherein the plurality of light-blocking patterns is formed and arranged in at least one of: a straight line shape of a predetermined length, an open-loop shape bent to surround only a part of at least one of the plurality of emission areas, and a mesh shape surrounding each of the emission areas.

6. The display device of claim 4, wherein the plurality of light-blocking patterns comprises first dummy patterns in a straight line shape that have a length of the straight line extended in a first diagonal direction according to a shape of the plurality of touch electrodes, and are arranged in parallel in a second diagonal direction perpendicular to the first diagonal direction.

7. The display device of claim 6, wherein the first dummy patterns are disposed in the second diagonal direction of at least one of first to fourth emission areas of each pixel group, and are formed in the straight line shape so that the length of the straight line is extended in the first diagonal direction.

8. The display device of claim 4, wherein the plurality of light-blocking patterns comprises second dummy patterns in a straight line shape that have a length of the straight line extended in a second diagonal direction according to a shape of the plurality of touch electrodes, and are arranged in parallel in a first diagonal direction perpendicular to the second diagonal direction.

9. The display device of claim 8, wherein the second dummy patterns are disposed in the first diagonal direction of at least one of first to fourth emission areas of each pixel group, and are formed in the straight line shape so that the length of the straight line is extended in the second diagonal direction.

10. The display device of claim 4, wherein the plurality of light-blocking patterns comprises third dummy patterns that surround some of the plurality of emission areas and have an overall shape formed in a mesh structure when viewed from top.

11. The display device of claim 4, wherein the plurality of light-blocking patterns comprises:
first dummy patterns in a straight line shape that have a length of the straight line extended in a first diagonal direction according to a shape of the plurality of touch electrodes, and are arranged in parallel in a second diagonal direction perpendicular to the first diagonal direction; and
second dummy patterns in a straight line shape that have a length of the straight line extended in the second diagonal direction according to the shape of the plurality of touch electrodes, and are arranged in parallel in the first diagonal direction perpendicular to the second diagonal direction.

12. The display device of claim 11, wherein the length of the straight line of each of the first and second dummy patterns is larger than or smaller than an overall width and length of one of the plurality of code patterns.

13. The display device of claim 11, wherein the plurality of light-blocking patterns further comprises third dummy patterns that surround some of the plurality of emission areas and have an overall shape formed in a mesh structure when viewed from top.

14. The display device of claim 13, wherein the size and overall shape of each of the third dummy patterns when viewed from the top is different from those of an adjacent third dummy pattern.

15. The display device of claim 13, wherein the first to third dummy patterns of difference shapes are arranged one after another repeatedly in the x-direction that is a horizontal direction, while the dummy patterns of a same shape are arranged in the y-direction that is a vertical direction when viewed from the top.

16. The display device of claim 4, wherein the plurality of light-blocking patterns comprises fourth dummy patterns formed in a shape surrounding in a x-direction that is a horizontal direction or in a y-direction that is a vertical direction of at least one of first to fourth emission areas forming a pixel group.

17. The display device of claim 4, wherein the plurality of light-blocking dummy patterns comprises fifth dummy patterns that are disposed in a first diagonal direction of at least two of first to fourth emission areas of a pixel group, and are formed so that a length of a straight line is extended in a second diagonal direction perpendicular to the first diagonal direction.

18. The display device of claim 4, wherein the plurality of light-blocking dummy patterns comprises fifth dummy patterns that are disposed in a x-axis direction that is a horizontal direction of at least two of first to fourth emission areas of a pixel group, and are formed so that a length of a straight line is extended in a y-axis direction perpendicular to the x-axis direction.

19. A touch input system comprising:
a display device configured to display images; and
a touch input device configured to input a touch to the display device,
wherein the display device comprises:
a display unit comprising a plurality of emission areas;
a plurality of touch electrodes disposed between the plurality of emission areas to sense a touch;
a plurality of code patterns formed by covering a part of a front surface of at least one of the plurality of touch electrodes with a predetermined code shape; and
a plurality of light-blocking patterns formed on at least one of the plurality of touch electrodes on which the plurality of code patterns is not formed, to block light,
wherein the plurality of light-blocking patterns is formed by covering at least one of a front surface and side surfaces of the at least one touch electrode with a predetermined pattern shape,
wherein the plurality of touch electrodes comprises a reflective material,
wherein the plurality of touch electrodes do not include a black pigment, and
wherein the plurality of code patterns comprises a light blocking material that includes the black pigment.

20. The system of claim 19, wherein the touch input device comprises a code detector that detects the plurality of code patterns;

a code processor that receives shape data for the plurality of code patterns, extracts a data code corresponding to the shape of the plurality of code patterns, and generates coordinate data corresponding to the data code; and a communications module that transmits the coordinate data to the display device.

\* \* \* \* \*